US009945903B2

United States Patent

(12) United States Patent
Ishii et al.

(10) Patent No.: US 9,945,903 B2
(45) Date of Patent: Apr. 17, 2018

(54) SEMICONDUCTOR DEVICE MANUFACTURING METHOD

(71) Applicant: Renesas Electronics Corporation, Tokyo (JP)

(72) Inventors: Toshitsugu Ishii, Takasaki (JP); Naohiro Makihira, Takasaki (JP); Hidekazu Iwasaki, Takasaki (JP); Jun Matsuhashi, Takasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/151,152

(22) Filed: May 10, 2016

(65) Prior Publication Data

US 2017/0025318 A1 Jan. 26, 2017

(30) Foreign Application Priority Data

Jul. 24, 2015 (JP) ................................. 2015-146314

(51) Int. Cl.
*H01L 21/66* (2006.01)
*G01R 31/28* (2006.01)
(Continued)

(52) U.S. Cl.
CPC .......... *G01R 31/2884* (2013.01); *H01L 21/56* (2013.01); *H01L 21/67242* (2013.01); *H01L 23/49541* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 23/3121* (2013.01); *H01L 23/49575* (2013.01); *H01L 23/544* (2013.01); *H01L 2223/54433* (2013.01); *H01L 2223/54486* (2013.01);
(Continued)

(58) Field of Classification Search
CPC ........ G01R 1/0483; G01R 1/04; G01R 1/045; G01R 1/0466; G01R 1/07314; G01R 31/2886; H01L 2924/0002; H01L 2924/00; H01L 23/32; H01R 13/193; H01R 13/2421; H01R 13/6596
See application file for complete search history.

(56) References Cited

U.S. PATENT DOCUMENTS 5,444,388 A * 8/1995 Ideta ........................ G01R 1/04 29/825
7,413,458 B2 * 8/2008 Miyaaki .............. G01R 1/0466 439/331

(Continued)

FOREIGN PATENT DOCUMENTS

JP H 05-283563 A 10/1993
JP H 06-342035 A 12/1994
JP 2014-086376 A 5/2014

*Primary Examiner* — Jaehwan Oh
(74) *Attorney, Agent, or Firm* — McGinn IP Law Group, PLLC

(57) ABSTRACT

This invention enhances reliability of an electrical test. A semiconductor device manufacturing method in which a potential (first potential) is supplied by bringing a plurality of first and second test terminals into contact with a plurality of leads, respectively in the step of supplying the potential to the leads (first leads) to carry out the electrical test. The first test terminals come into contact with the leads, individually, and the second test terminals come into contact with the leads in one batch.

19 Claims, 17 Drawing Sheets

(51) Int. Cl.

| | |
|---|---|
| ***H01L 21/56*** | (2006.01) |
| ***H01L 21/67*** | (2006.01) |
| ***H01L 23/495*** | (2006.01) |
| ***H01L 23/00*** | (2006.01) |
| *H01L 23/31* | (2006.01) |
| *H01L 23/544* | (2006.01) |

(52) U.S. Cl.

CPC ............... *H01L 2224/04042* (2013.01); *H01L 2224/2929* (2013.01); *H01L 2224/29339* (2013.01); *H01L 2224/32245* (2013.01); *H01L 2224/45144* (2013.01); *H01L 2224/45147* (2013.01); *H01L 2224/48091* (2013.01); *H01L 2224/48101* (2013.01); *H01L 2224/48106* (2013.01); *H01L 2224/48137* (2013.01); *H01L 2224/48245* (2013.01); *H01L 2224/48247* (2013.01); *H01L 2224/73265* (2013.01); *H01L 2224/85203* (2013.01); *H01L 2224/85205* (2013.01); *H01L 2224/85207* (2013.01); *H01L 2224/92247* (2013.01); *H01L 2924/014* (2013.01); *H01L 2924/0105* (2013.01); *H01L 2924/01028* (2013.01); *H01L 2924/01029* (2013.01); *H01L 2924/01046* (2013.01); *H01L 2924/01047* (2013.01); *H01L 2924/01079* (2013.01); *H01L 2924/01083* (2013.01); *H01L 2924/17747* (2013.01); *H01L 2924/181* (2013.01); *H01L 2924/19042* (2013.01)

(56) References Cited

U.S. PATENT DOCUMENTS

| | | | | |
|---|---|---|---|---|
| 8,911,266 | B2 * | 12/2014 | Kawate | G01R 1/0483 439/700 |
| 8,957,693 | B2 * | 2/2015 | Tsubaki | G01R 1/07314 324/756.02 |
| 2004/0046581 | A1 * | 3/2004 | Maekawa | G01R 1/0483 324/754.03 |
| 2010/0041254 | A1 * | 2/2010 | Hsu | H05K 7/1046 439/73 |
| 2012/0313655 | A1 * | 12/2012 | Bald | G01R 31/025 324/750.01 |
| 2014/0027891 | A1 * | 1/2014 | Kimura | H01L 23/3107 257/675 |
| 2014/0252551 | A1 * | 9/2014 | Dix | H01L 23/642 257/532 |
| 2014/0253225 | A1 * | 9/2014 | Lee | H04L 25/4902 327/535 |
| 2014/0253227 | A1 * | 9/2014 | Yach | H04L 25/4902 327/540 |
| 2015/0037575 | A1 * | 2/2015 | Sakaguchi | H05K 7/20481 428/354 |
| 2015/0130022 | A1 * | 5/2015 | Watanabe | H01L 28/10 257/531 |
| 2016/0277043 | A1 * | 9/2016 | Takeda | H04B 1/40 |

* cited by examiner

SEMICONDUCTOR DEVICE MANUFACTURING METHOD

CROSS-REFERENCE TO RELATED APPLICATIONS

The disclosure of Japanese Patent Application No. 2015-146314 filed on Jul. 24, 2015 including the specification, drawings and abstract is incorporated herein by reference in its entirety.

BACKGROUND

The present invention relates to a technology for manufacturing a semiconductor device, including the step of carrying out an electrical test after the assembly of the semiconductor device.

Japanese Unexamined Patent Application Publication No. 2014-86376 (Patent Document 1) discloses a method of carrying out an electrical test by pressing vertically movable connection pins against the under surfaces of the lead terminals of an electronic part with the force of a spring.

Japanese Unexamined Patent Application Publication No. Hei 5 (1993)-283563 (Patent Document 2) and Japanese Unexamined Patent Publication No. Hei 6 (1994)-342035 (Patent Document 3) disclose a method of carrying out an electrical test by pressing contact pins having a curved part against the under surfaces of the leads of a semiconductor device.

Further, the above Patent Documents 1 to 3 teach that the top surface sides of the leads are held by another member when the contact pins are pressed against the under surfaces of the leads.

RELATED ART DOCUMENTS

Patent Documents

[Patent Document 1]
Japanese Unexamined Patent Application Publication No. 2014-86376
[Patent Document 2]
Japanese Unexamined Patent Application Publication No. Hei 5 (1993)-283563
[Patent Document 3]
Japanese Unexamined Patent Application Publication No. Hei 6 (1994)-342035

SUMMARY

In an electrical test on a semiconductor device, there is a case where the same potential is supplied to a plurality of terminals. For instance, as an example of the above electrical test, in the case of a semiconductor device having a high-voltage circuit to which relatively high potential is supplied and a low-voltage circuit to which relatively low electricity is supplied, there is a withstand voltage test between the high-voltage circuit and the low-voltage circuit.

To improve the reliability of the above electrical test, a technology for supplying potential to each of the terminals surely is required.

Other objects and new features will become apparent from the following description and the accompanying drawings.

In a semiconductor device manufacturing method according to an embodiment of the present invention, in the step of carrying out an electrical test by supplying a first potential to a plurality of first leads, the above first potential is supplied by bringing a plurality of test terminals into contact with the respective first leads. First test terminals out of the above test terminals are arranged in contact with the respective first leads, and a second test terminal is arranged in contact with the first leads in one batch.

According to the above embodiment, the reliability of the electrical test can be improved.

Figure 1:
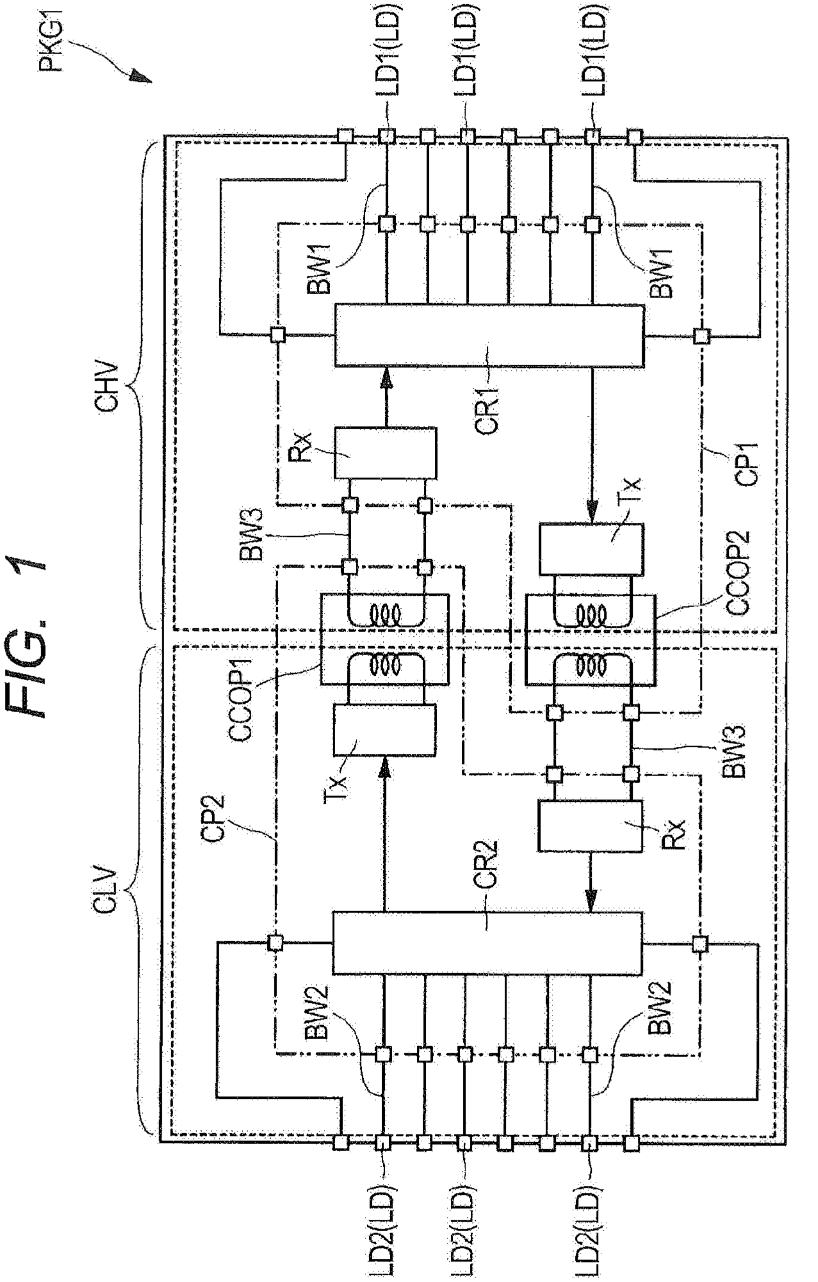
FIG. 1 is a block diagram of the circuit configuration of a semiconductor device according to an embodiment of the invention.

DETAILED DESCRIPTION (Explanation of Description Format, Basic Terminology and Usage in the Present Application)

In the present application, the embodiment is described by dividing it into a plurality of sections for convenience's sake as required. Except for a case where it is explicitly stated that it is not so, these sections are not independent and not separated from one another and form parts of a single example no matter whether they are described before or after, and one is partial details of the other or a partial or whole variation of the other. As a basic rule, the explanation of the same part is omitted. Each constituent element in the embodiment is not essential except for a case where it is explicitly stated that it is not so, a case where it is theoretically limited to a specified number, and a case where it is obvious from the text that it is not so.

In the description of the embodiment, as for materials and compositions, the phrase "X made of A" does not exclude X containing an element other than A except for a case where it is explicitly stated that it is not so and a case where it is obvious from the text that it is not so. For instance, as for components, this phrase means that "X containing A as the main component". For example, it is needless to say that "silicon member" is not limited to a pure silicon member but includes a member containing a SiGe (silicon.germanium) alloy or a multi-element alloy containing silicon as the main component and other additives. Gold plating, Cu layer and nickel plating include not only pure ones but also members containing gold, Cu or nickel as the main component except for a case where it is explicitly stated that it is not so.

Further, when specific numbers and amounts are mentioned, they may be smaller or larger than the specified values except for a case where it is explicitly stated they are not so, a case where they are theoretically limited to these values and a case where it is obvious from the text that they are not so.

Although the terms "plane surface" and "side surface" are used in the present application, a surface parallel to a reference surface over which the semiconductor elements of a semiconductor chip are to be formed is described as a plane surface. A surface intersecting the plane surface is described as a side surface. In side view, a direction coupling two plane surfaces apart from each other is described as a thickness direction.

Further, the terms "top surface" or "under surface" may be used in the present application. Since there are various modes for mounting a semiconductor package, after a semiconductor package is mounted, the top surface thereof may be located below the under surface. In the present invention, a plane surface on the side for forming the elements of a semiconductor chip or a plane surface on the side for mounting the chips of a wiring substrate is described as "top surface" and a surface on the opposite side to the top surface is described as "under surface".

In the drawings of the embodiment, the same or similar parts are given the same or similar reference symbols or numbers, and their descriptions are basically not repeated.

In the attached drawings, hatching may be omitted even in the case of a sectional view when it is complicated or when a distinction from a space is clear. In association with this, when it is obvious from an explanation, even in the case of a closed hole in plan view, the outline of the background may be omitted. Further, to clearly show that it is not a space even though it is not a section or to clearly show the boundary of a certain area, hatching or a dot pattern may be added.

<Semiconductor Device>

Figure 2:
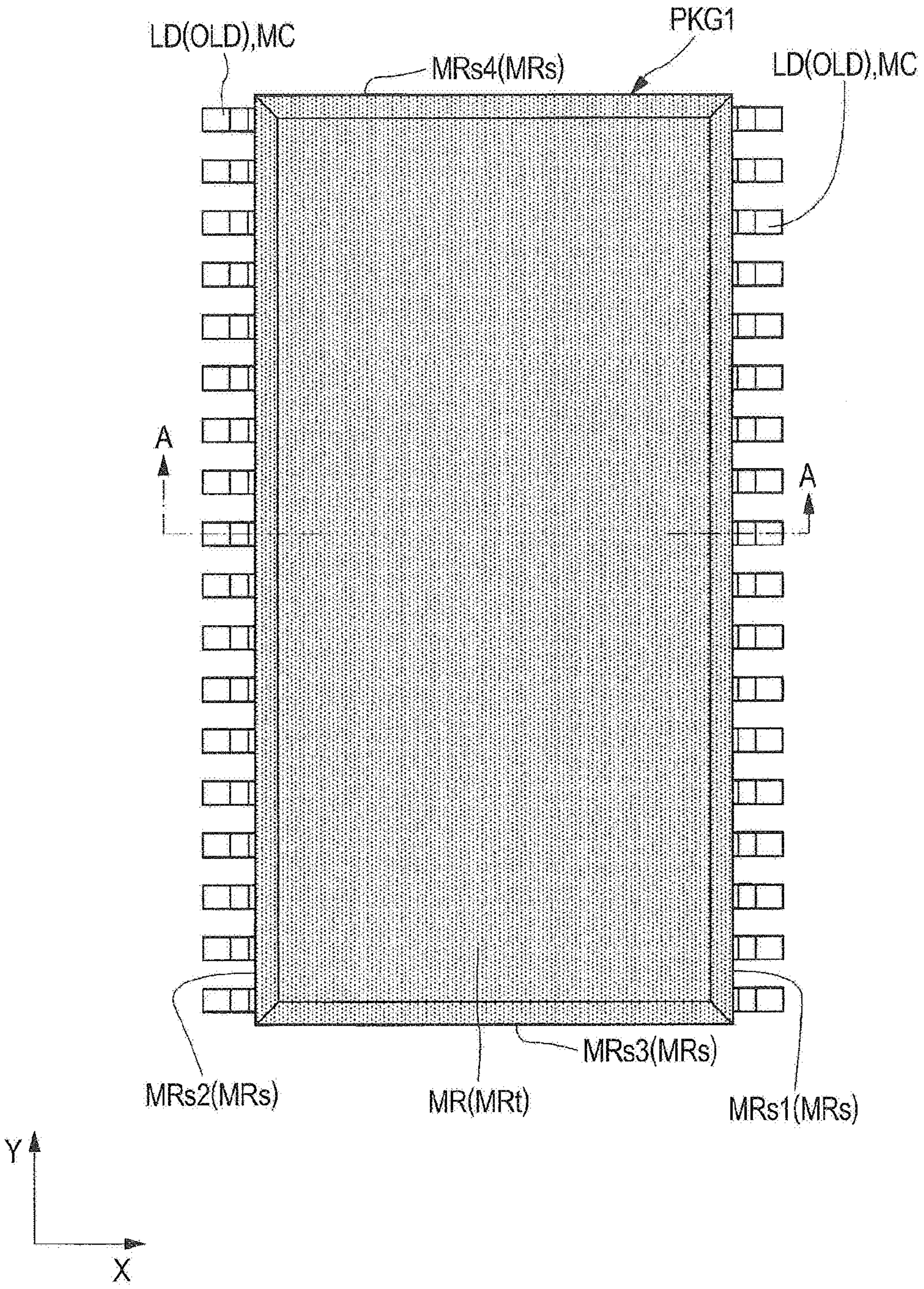
FIG. 2 is a top view of the semiconductor device shown in FIG. 1.
Figure 3:
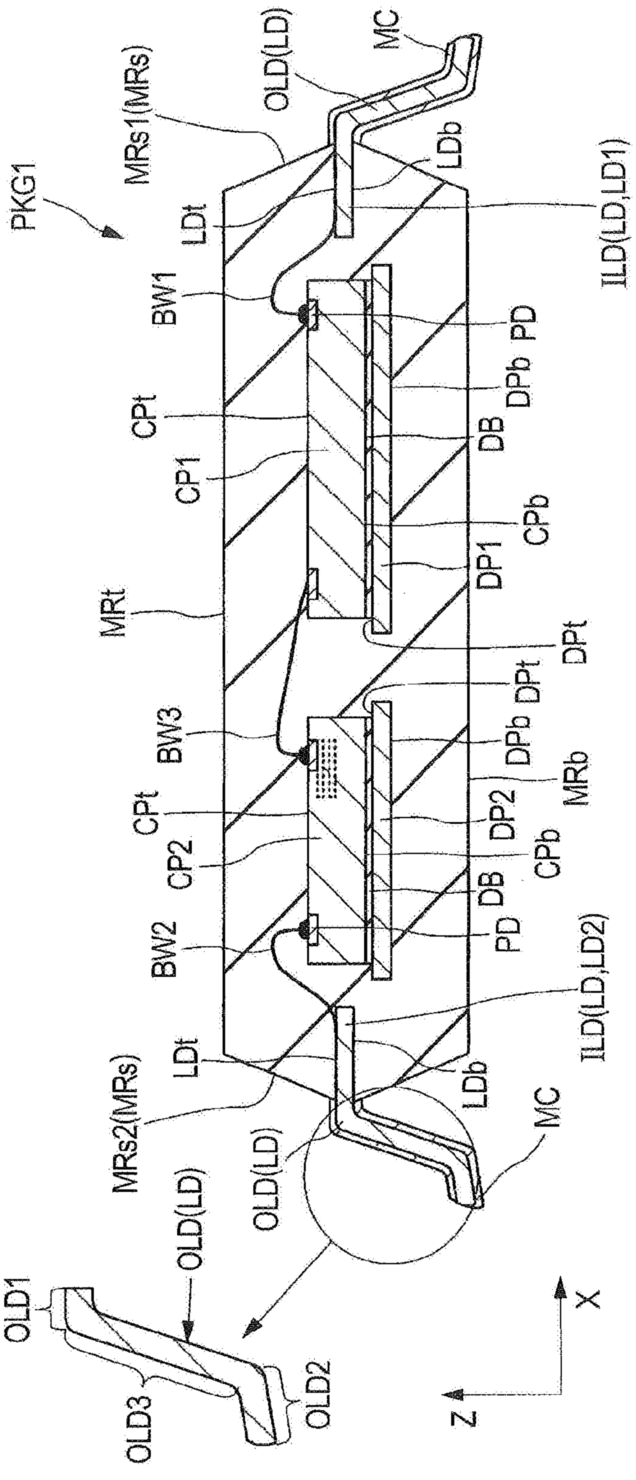
FIG. 3 is a sectional view cut on line A-A of FIG. 2.
Figure 4:
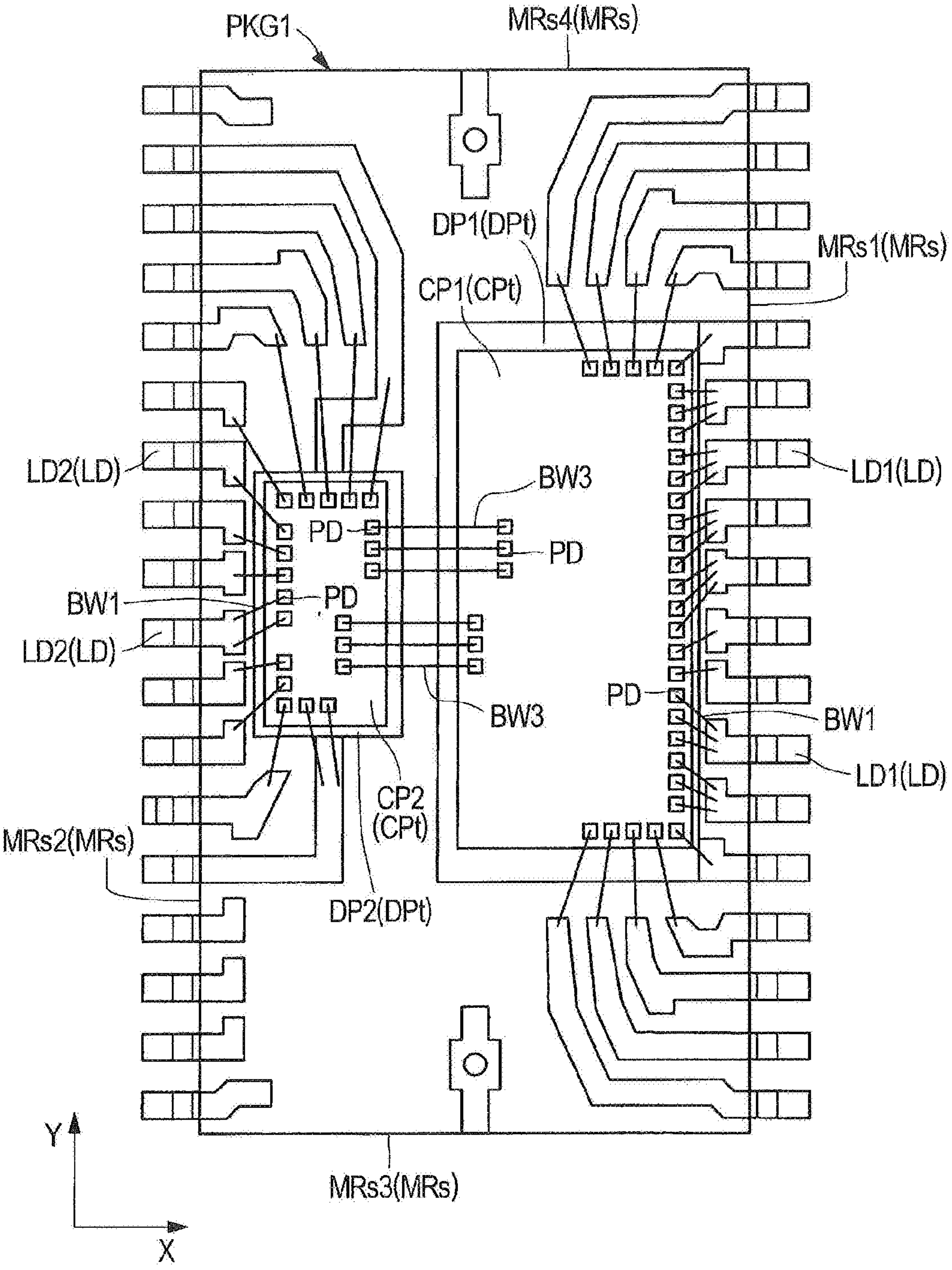
FIG. 4 is a plan view showing the internal structure of the semiconductor device when a sealing body shown in FIG. 2 is removed.

A semiconductor device PKG1 according to an embodiment of the present invention will be described with reference to FIGS. 1 to 4. FIG. 1 is a block diagram showing the circuit configuration of the semiconductor device of this embodiment. FIG. 2 is a top view of the semiconductor device shown in FIG. 1. FIG. 3 is a sectional view cut on line A-A of FIG. 2. FIG. 4 is a plan view showing the internal structure of the semiconductor device when a sealing body shown in FIG. 2 is removed.

Technology which will be described hereinbelow can be applied to various semiconductor devices in addition to examples of a semiconductor device which will be explained hereinbelow. In this embodiment, a semiconductor device having a high-voltage circuit which operates at a relatively high voltage and a low-voltage circuit which operates at a voltage lower than that of the high-voltage circuit, both circuits being incorporated into one package, and a coupling circuit for transmitting a signal between the high-voltage circuit and the low-voltage circuit both of which are insulated from each other will be described hereinbelow.

As shown in FIG. 1, the semiconductor device PKG1 has a high-voltage circuit CHV which operates at a relatively high voltage and a low-voltage circuit CLV which operates at a voltage lower than that of the high-voltage circuit CHV. The high-voltage circuit CHV and the low-voltage circuit CLV are insulated from each other. Signal transmission paths are formed between the high-voltage circuit CHV and the lower-voltage circuit CLV through a coupling circuit CCOP1 and a coupling circuit CCOP2. One end of each of the coupling circuit CCOP1 and the coupling circuit CCOP2 is coupled to a transmission circuit Tx and the other end is coupled to a receiving circuit Rx.

As for signal transmission using couplers, an electric signal input into the transmission circuit Tx is transmitted as a signal other than an electric signal and input into the receiving circuit Rx in the coupling circuit CCOP1 or the coupling circuit CCOP2.

In this embodiment, the coupling circuits CCOP1 and the coupling circuit CCOP2 are induction coupling type coupling circuits which transmit a signal by making use of electromagnetic induction between inductors arranged opposed to each other. Although induction coupling type coupling circuits CCOP1 and CCOP2 are used in this embodiment, variations of the coupling system of a signal transmission path may be employed. For example, an optical coupling type coupling circuit which converts an electric signal into an optical signal and transmits the signal by using light may be used.

An electronic part such as the semiconductor device PKG1 which has signal transmission paths for intercoupling the high-voltage circuit CHV and the low-voltage circuit CLV insulated from each other is used as an isolator which is incorporated into a power supply circuit for supplying power to an electric part having large power consumption such as a motor. When the function of insulating the high-voltage circuit CHV into which drive power is input and the low-voltage circuit CLV into which a control signal is input from each other is improved in the semiconductor device PKG1, an isolator having high pressure resistance is obtained.

In this embodiment, the semiconductor device PKG1 has a plurality of semiconductor chips as shown in FIG. 1. That is, as shown by dotted lines in FIG. 1, the semiconductor device PKG1 has a semiconductor chip CP1 in which the high-voltage circuit CHV is formed as the main element and a semiconductor chip CP2 in which the low-voltage circuit CLV is formed as the main element.

In the example shown in FIG. 1, the semiconductor chip CP1 in which the high-voltage circuit CHV is formed as the main element has a main circuit CR1, the receiving circuit Rx of the high-voltage circuit CHV electrically coupled to the main circuit CR1, and the coupling circuit CCOP2 for transmitting a signal from the transmission circuit Tx of the high-voltage circuit CHV to the receiving circuit Rx of the low-voltage circuit CLV. Meanwhile, the semiconductor chip CP2 in which the low-voltage circuit CLV is formed as the main element has a main circuit CR2, the transmission circuit Tx electrically coupled to the main circuit CR2 and the coupling circuit CCOP1 for transmitting a signal from the transmission circuit Tx of the low-voltage circuit CLV to the receiving circuit Rx of the high-voltage circuit CHV.

The coupling circuit CCOP1 and the coupling circuit CCOP2 have a part configuring the high-voltage circuit CHV and a part configuring the low-voltage circuit CLV, respectively. Therefore, the semiconductor chip CP1 has part of the low-voltage circuit CLV, and the semiconductor chip CP2 has part of the high-voltage circuit CHV.

The coupling circuit CCOP1 is electrically coupled to the receiving circuit Rx of the high-voltage circuit CHV by wires (conductive member) BW3, and the coupling circuit CCOP2 is electrically coupled to the receiving circuit Rx of the low-voltage circuit CLV by wires (conductive member) BW3.

As for the number of the semiconductor chips and which circuits are to be formed in which semiconductor chip, there are variations.

For example, both of the high-voltage circuit CHV and the low-voltage circuit CLV shown in FIG. 1 may be formed in one semiconductor chip. In this case, a plurality of the wires BW3 shown in FIG. 1 may not be provided. Alternatively, inductors configuring the coupling circuits may be formed in different semiconductor chips and mounted opposed to each other. Also in this case, a plurality of the wires BW3 shown in FIG. 1 may not be formed.

Alternatively, both of the coupling circuit CCOP1 and the coupling circuit CCOP2 may be formed in either one of the semiconductor chip CP1 and the semiconductor chip CP2.

Alternatively, as a variation of this embodiment, when only signal transmission is carried out from the low-voltage circuit CLV to the high-voltage circuit CHV, the coupling circuit CCOP2 may not be provided. By providing the coupling circuit CCOP1 and the coupling circuit CCOP2 as in this embodiment, the result of signal transmission can be verified.

The main circuit CR1 of the semiconductor chip CP1 is a circuit which operates at a relatively high voltage and includes, for example, a driver circuit or a switching circuit. The main circuit CR1 is electrically coupled to a plurality of leads LD1 by a plurality of wires BW1 coupled to the semiconductor chip CP1.

Meanwhile, the main circuit CR2 of the semiconductor chip CP2 is a circuit which operates at a relatively low voltage and includes, for example, a control circuit for controlling the driving of the high-voltage circuit CHV. The main circuit CR2 is electrically coupled to a plurality of leads LD2 by a plurality of wires BW2 coupled to the semiconductor chip CP2.

<Structure of Appearance>

A description is subsequently given of the structure of the appearance of the semiconductor device PKG1. As shown in FIG. 2, the planar shape of a sealing body (resin body) MR is quadrangular (rectangular in an example shown in FIG. 2). The sealing body MR has a top surface (top surface of the sealing body) MRt, an under surface (rear surface, mounting surface, under surface of the sealing body) MRb (see FIG. 3) on the opposite side to the top surface MRt, and side surfaces (side surfaces of the sealing body) MRs between the top surface MRt and the under surface MRb.

The sealing body MR has a long side surface (side) MRs1 extending in a Y direction, a long side surface (side) MRs2 on the opposite side to the long side surface MRs1, a short side surface (side) MRs3 extending in an X direction intersecting the Y direction and a short side surface (side) MRs4 on the opposite side to the short side surface MRs3 in plan view.

Further, the sealing body MR of this embodiment has a rectangular planar shape, and a plurality of leads LD are arranged along the long side surface MRs1 and the long side surface MRs2 out of the four side surfaces of the sealing body MR. In other words, the leads LD project from the long side surface MRs1 and the long side surface MRs2 out of the four side surfaces of the sealing body MR.

Meanwhile, no leads LD are arranged on the short side surface MRs3 and the short side surface MRs4 of the sealing body MR. In other words, no leads LD project from the short side surface MRs3 and the short side surface MRs4 of the sealing body MR.

Thus, the semiconductor package having the leads along the long side surfaces opposed to each other is called "SOP (Small Outline Package) type semiconductor device". Technology which will be described hereinbelow can be applied to variations of the semiconductor package. For example, it may be applied to an unshown semiconductor package called "QFP (Quad Flat Package)" in which a plurality of leads LD project along the four side surfaces of the sealing body MR.

The leads are made of a metal material. In this embodiment, the leads made of a metal containing copper (Cu) as the main component are used. Each of the leads LD has an inner lead part ILD (see FIG. 3 and FIG. 4) sealed in the sealing body MR and an outer lead part OLD exposed from the sealing body MR.

The outer lead part OLD of each of the leads LD projects outward from the sealing body MR on the side surfaces MRs (more specifically, the long side surface MRs1 and the long side surface MRs2) of the sealing body MR. The outer lead part OLD (part exposed from the sealing body MR) of each of the leads has a projecting part (projecting part OLD1) from the center part of the side surface MRs of the sealing body MR as shown in FIG. 3. The outer lead part OLD has a part (mounting part OLD2) which is opposed to a terminal of an unshown mounting substrate when the semiconductor device PKG1 is mounted on the unshown mounting substrate. The outer lead part OLD has an inclined part (inclined part ODL3) which is situated between the projecting part OLD1 and the mounting part OLD2 and inclined with respect to the mounting surface (under surface MRb) of the semiconductor device PKG1.

As shown in FIG. 3, the front surface (exposed surface, outer surface) of the outer lead part OLD of the lead LD and the under surface DPb of a die pad DP1 are covered with a metal film (metal coating film) MC. The metal film MC is a plating film formed by plating, specifically an electroplating film formed by electroplating. For example, the metal film MC is made of a metal material having higher wettability to solder than copper which is a substrate such as solder and a metal coating film which covers the surface of a copper member as a substrate. Solder wettability at the time of mounting the semiconductor device PKG1 to an unshown mounting substrate can be improved by forming the metal film MC made of solder over the outer lead part OLD of each of the leads LD which are the outer terminals of the semiconductor device PKG1. Thereby, bonding strength between the leads LD and the terminals on the mounting substrate side can be improved.

In this embodiment, the metal film MC is made of so-called "lead-free solder" which contains substantially no lead (Pb), for example, tin (Sn) only or a metal material containing tin as the main component such as tin-bismuth (Sn—Bi) or tin-copper-silver (Sn—Cu—Ag). The term "lead-free solder" means solder having a lead (Pb) content of not more than 0.1 wt %. This content is determined based on the standard of a RoHS (Restriction of Hazardous substances) command. When a solder material or a solder component is explained in this embodiment, it refers to lead-free solder except for a case where it is explicitly stated that it is not.

In an example shown in FIG. 3, the metal film MC which is a solder film is formed over the exposed surface of the outer lead part OLD of the lead LD by plating. There are variations of the metal film MC. For example, the metal film MC may be a laminate film including a metal film containing nickel (Ni) as the main component and a metal film containing palladium (Pd) as the main component. Alternatively, a metal film containing gold (Au) as the main component may be further formed over the surface of a metal film containing palladium as the main component. Alternatively, when the metal film MC is made of a material other than solder, the metal film MC may be formed to cover the surfaces of the inner lead parts ILD and the outer lead parts OLD of the leads LD.

<Internal Structure>

A description is subsequently given of the internal structure of the semiconductor device PKG1. As shown in FIG. 3 and FIG. 4, the semiconductor device PKG1 has a die pad DP1 for mounting the semiconductor chip CP1 and a die pad DP2 for mounting the semiconductor chip CP2.

As shown in FIG. 3, each of the die pad DP1 and the die pad DP2 has a top surface DPt and an under surface DPb on the opposite side to the top surface DPt. In the example shown in FIG. 3, the under surfaces DPb of the die pads DP1 and DP2 do not expose from the sealing body MR, and the die pads DP1 and DP2 are entirely sealed by the sealing body MR.

As shown in FIG. 4, the top surfaces (chip mounting surfaces) DPt of the die pads DP1 and DP2 have a quadrangular planar shape (quadrilateral). In this embodiment, they are, for example, rectangular. In plan view, the die pad DP1 for mounting the semiconductor chip CP1 is arranged along the long side surface MRs1 out of the four side surfaces of the sealing body MR. Meanwhile, the die pad DP2 for mounting the semiconductor chip CP2 is arranged along the long side surface MRs2 out of the four side surfaces of the sealing body MR.

The semiconductor chip CP1 is mounted over the die pad DP1. The semiconductor chip CP2 is mounted over the die pad DP2. As shown in FIG. 3, each of the semiconductor chips CP1 and CP2 has a front surface (main surface, top surface) CPt, a rear surface (main surface, under surface) CPb on the opposite side to the front surface CPt, and side surfaces between the front surface CPt and the rear surface CPb.

In the example shown in FIG. 3, the semiconductor chips CP1 and CP2 are mounted over the die pad DP1 and the die pad DP2 through a die bonding material (bonding material) DB in such a manner that the rear surfaces CPb are opposed to the top surfaces DPt of the die pads DP1 and DP2, respectively. That is, they are mounted according to so-called "face-up mounting system" in which a surface (rear surface CPb) on the opposite side to the front surface (main surface) CPt over which a plurality of pads PD are formed is opposed to the chip mounting surface (top surface DPt).

The die bonding material DB is a bonding material for die bonding the semiconductor chips CP. A resin bonding material, a conductive bonding material produced by containing metal particles of silver (Ag) in a resin bonding material or a solder material may be used as the die bonding material DB. When a solder material is used as the die bonding material DB, a solder material containing lead may be used to raise the melting point.

In this embodiment, the die pad DP1 and the die pad DP2 are coupled to leads (terminals) LD to which a reference potential is supplied. Therefore, when the die bonding material DB is formed from a conductive material, a reference potential can be supplied from the rear surfaces CPb of the semiconductor chip CP1 and the semiconductor chip CP2.

As shown in FIG. 4, the planar shapes of the semiconductor chips CP1 and CP2 mounted over the die pads DP1 and DP2 are quadrangular. In this embodiment, they are, for example, rectangular. In the example shown in FIG. 4, the planar size (area of the front surface CPt) of the semiconductor chip CP1 is larger than the planar size (area of the front surface CPt) of the semiconductor chip CP2.

A plurality of pads (bonding pads) PD are formed over the front surface CPt of the semiconductor chip CP. In the example shown in FIG. 4, the pads PD are formed along the sides of the front surface CPt. In other words, the pads PD are arranged along the long side surfaces opposed to each other. The pads PD are also arranged along the short side surfaces opposed to each other.

A plurality of unshown semiconductor elements (circuit elements) are formed over the main surfaces (specifically, the areas for forming semiconductor elements formed in the top surface of the substrate (semiconductor substrate) of the semiconductor chip CP) of the semiconductor chip CP1 and the semiconductor chip CP2. The pads PD are electrically coupled to the semiconductor elements by wires (not shown) formed in a wiring layer formed in the inside (specifically, between the front surface CPt and the unshown semiconductor element formed area) of the semiconductor chip CP.

A pair of inductors configuring the coupling circuit CCOP1 or the coupling circuit CCOP2 shown in FIG. 1 are formed in the wiring layer formed in the inside (specifically, between the front surface CPt and the unshown semiconductor element formed area) of the semiconductor chip CP.

The semiconductor chip CP1 is electrically coupled to the leads LD1 by a plurality of wires BW1. The semiconductor chip CP2 is electrically coupled to the leads LD2 by a plurality of wires BW2. The semiconductor chip CP1 and the semiconductor chip CP2 are electrically intercoupled by a plurality of wires BW3.

As shown in FIG. 4, leads LD1 coupled to the high-voltage circuit CHV (see FIG. 1) out of the leads LD are arranged along the long side surface MRs1 of the sealing body MR. Leads LD2 coupled to the low-voltage circuit CLV (see FIG. 1) out of the leads LD are arranged along the long side surface MRs2 of the sealing body MR.

Thus, the leads LD1 coupled to the high-voltage circuit CHV and the leads LD2 coupled to the low-voltage circuit CLV are arranged on the different side surfaces so that there is a creepage distance between the leads LD1 and the leads LD2. When the leads LD1 and the leads LD2 are arranged along the opposite side surfaces as shown in FIG. 2, the creepage distance between the leads LD1 and the leads LD2 can be made large.

<Semiconductor Device Manufacturing Method>

Figure 5:
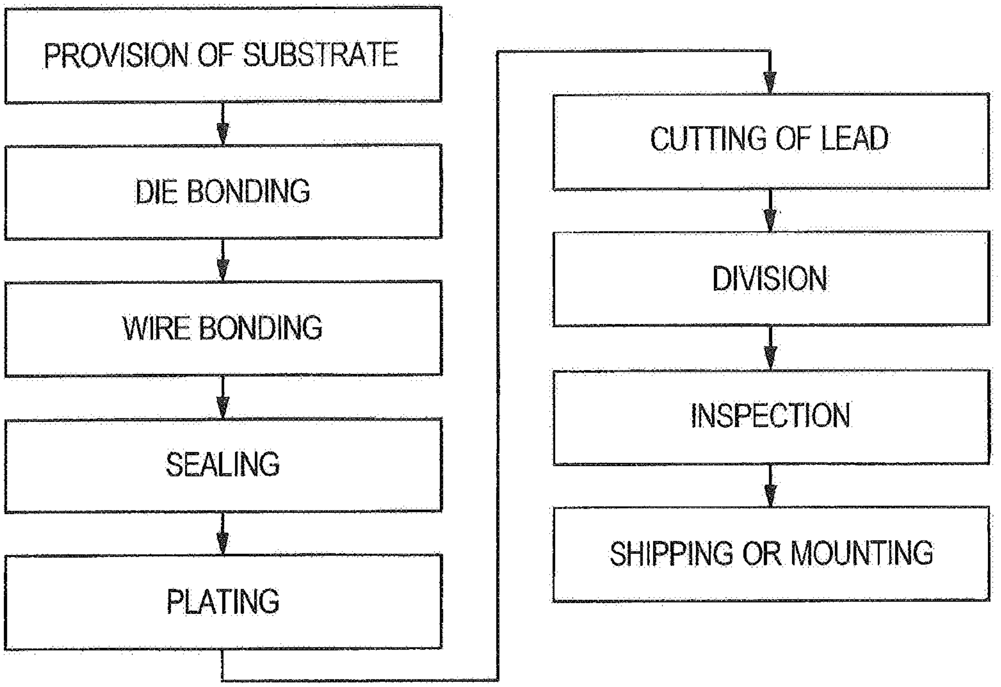
FIG. 5 is a diagram showing a flow of the semiconductor device manufacturing process explained with reference to FIGS. 2 to 4.

The process for manufacturing the semiconductor device PKG1 which has been described with reference to FIGS. 2 to 4 will be described with reference to a flow chart shown in FIG. 5. FIG. 5 is a diagram showing a manufacturing flow of the semiconductor device which has been described with reference to FIGS. 2 to 4.

Although FIG. 5 shows the main steps of the manufacturing process of the semiconductor device PKG1, variations may be employed in addition to the steps shown in FIG. 5. For example, a marking step for forming a product identification mark over the sealing body MR is not shown in FIG. 5 but may be added between the sealing step and the plating step.

<Substrate Providing Step>

Figure 6:
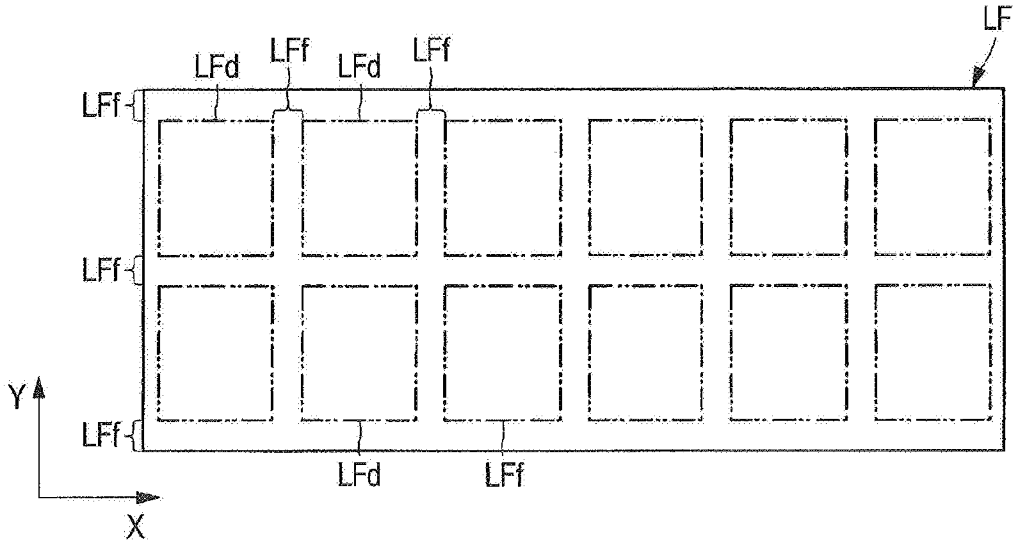
FIG. 6 is a plan view of a lead frame provided in a substrate providing step shown in FIG. 5.
Figure 7:
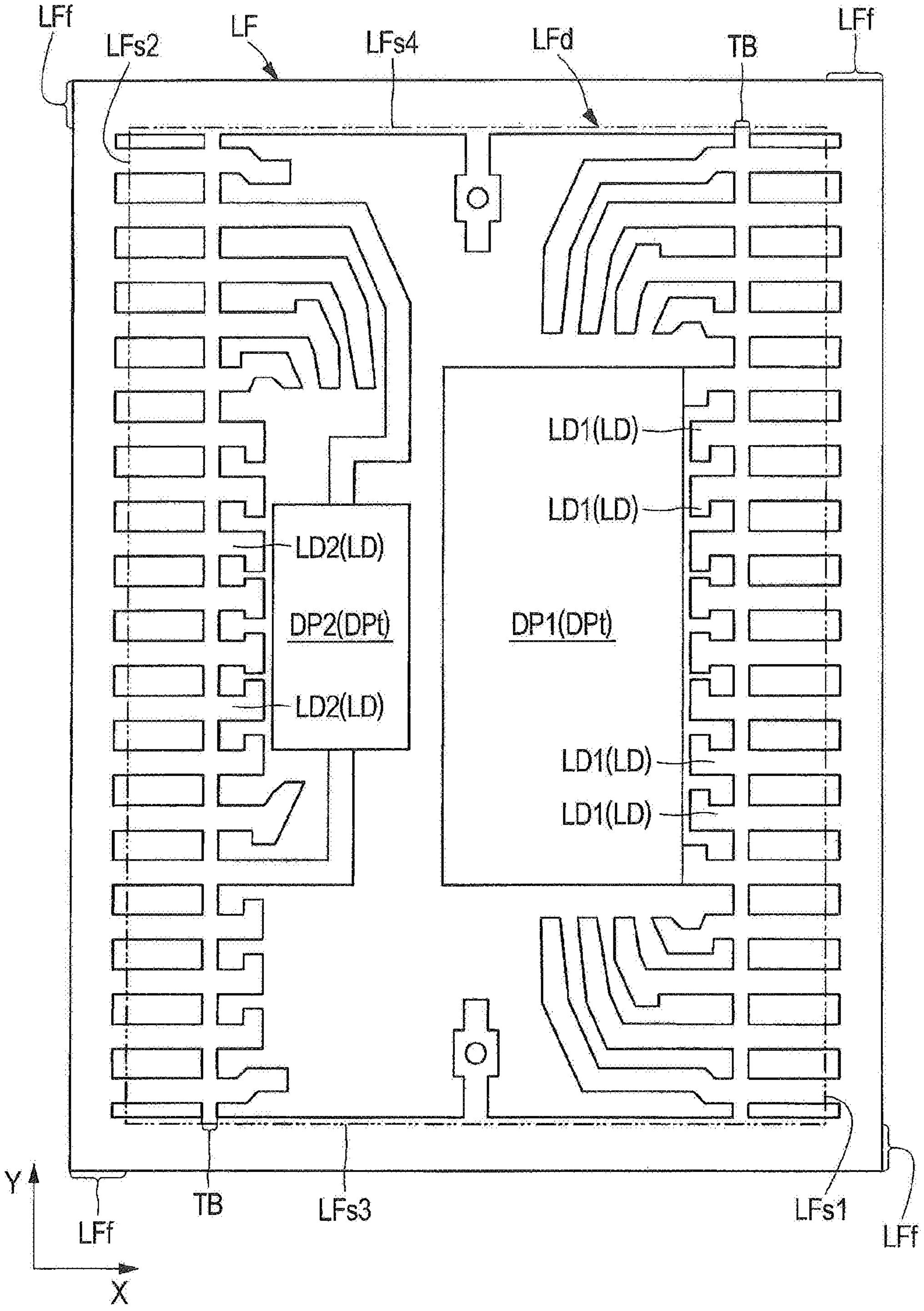
FIG. 7 is an enlarged plan view showing that semiconductor chips are mounted over two die pads of the lead frame shown in FIG. 6, respectively.

In the substrate providing step shown in FIG. 5, a lead frame LF shown in FIG. 6 is provided. FIG. 6 is a plan view of the lead frame provided in the substrate providing step shown in FIG. 5. FIG. 7 is an enlarged plan view of one of the device areas of the lead frame shown in FIG. 6.

As shown in FIG. 6, the lead frame LF provided in this step has a plurality of device areas LFd surrounded by frame parts LFf in plan view. The lead frame LF is made of a metal, for example, a metal containing copper (Cu) as the main component in this embodiment.

In this embodiment, as shown in FIG. 5, an example in which a plating step is carried out after a sealing step to form the metal film MC shown in FIG. 3 over the outer lead part OLD will be explained. As a variation of this, the surface of a substrate containing copper as the main component may be covered with the metal film MC in the substrate providing step. In this case, the exposed surface of the lead frame LF is entirely covered with the metal film MC.

As shown in FIG. 7, the device area LFd has a quadrangular planar shape. In this embodiment, the device area LFd is rectangular. The device area LFd has a long side LFs1 extending in the Y direction, a long side LFs2 on the opposite side to the long side LFs1, a short side LFs3 extending in the X direction intersecting the Y direction and a short side LFs4 on the opposite side to the short side LFs3 in plan view.

The die pad DP1, the die pad DP2 and the leads LD are provided in the device area LFd. In this embodiment, the die pad DP1 is closer to the long side LFs1 than to the long side LFs2 of the device area LFd. On the other hand, the die pad DP2 is closer to the long side LFs2 than to the long side LFs1 of the device area LFd.

Out of the leads LD, leads LD1 coupled to the high-voltage circuit CHV (see FIG. 1) are arranged along the device area LFd. Out of the leads LD, leads LD2 coupled to the low-voltage circuit CLV (see FIG. 1) are arranged along the device area LFd.

The leads LD1 and the leads LD2 are intercoupled by tie bars TB. The tie bars TB function as coupling members for intercoupling the leads LD and also as dam members for suppressing the leakage of a resin in the sealing step shown in FIG. 5.

<Die Bonding Step>

Figure 8:
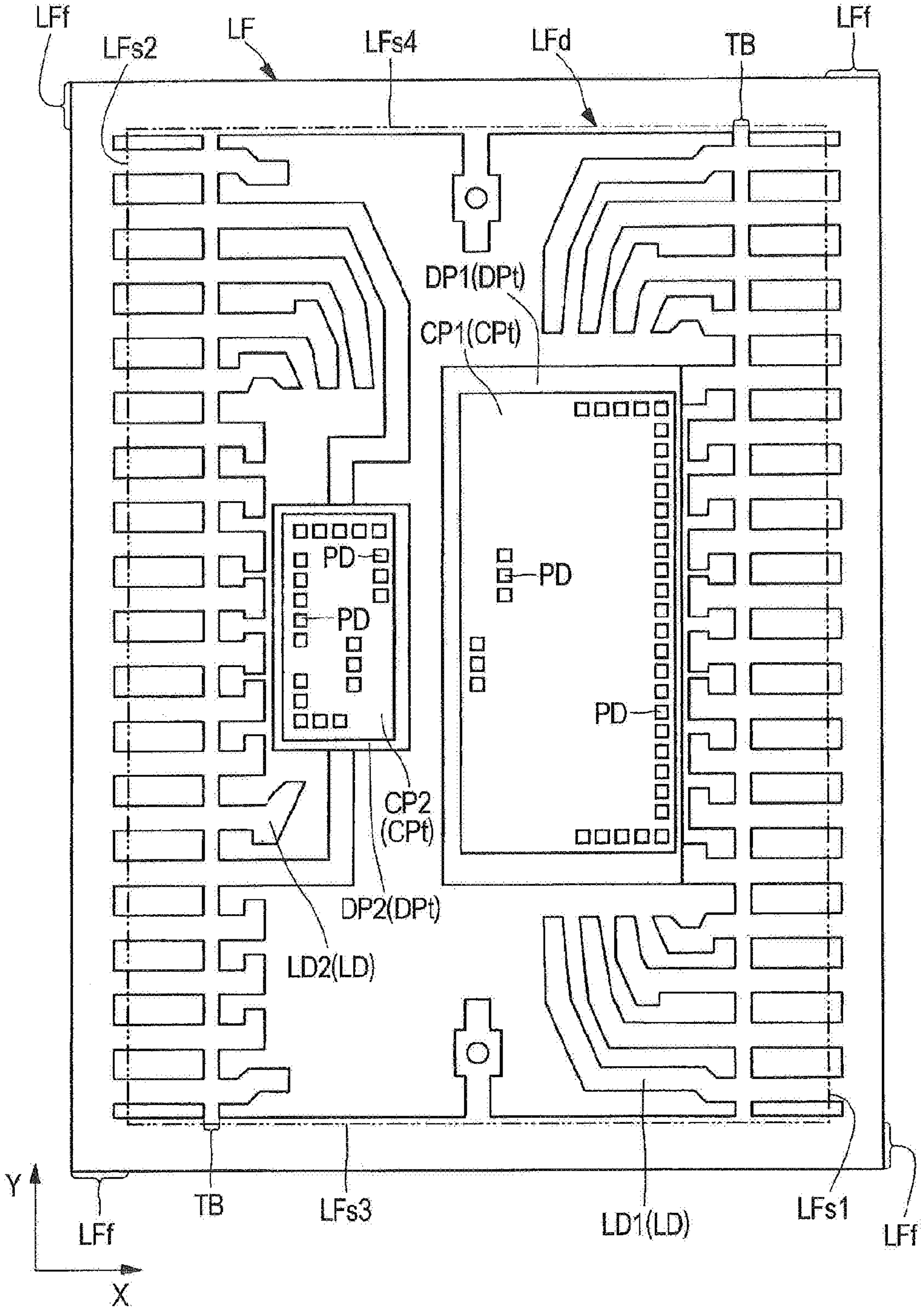
FIG. 8 is an enlarged plan view showing that semiconductor chips are mounted over two die pads of the lead frame shown in FIG. 7, respectively.

Then, the semiconductor chip CP1 is mounted over the die pad DP1 as shown in FIG. 8 in the die bonding step shown in FIG. 5. FIG. 8 is an enlarged plan view showing that semiconductor chips are mounted over the two die pads of the lead frame shown in FIG. 7, respectively.

As described with reference to FIG. 3, each of the semiconductor chip CP1 and the semiconductor chip CP2 has the front surface CPt to which the pads PD are exposed and the rear surface CPb (see FIG. 3) on the opposite side to the front surface CPt. In this step, the semiconductor chip CP1 and the die pad DP1 are bonded together by the die bonding material DB (see FIG. 3) which is a conductive bonding material provided, for example, by containing metal particles of silver (Ag) in a resin bonding material. Similarly, in this step, the semiconductor chip CP2 and the die pad DP2 are bonded together by the die bonding material DB (see FIG. 3) in this step. The order of mounting the semiconductor chip CP1 and the semiconductor chip CP2 is not particularly limited.

After the semiconductor chip CP1 and the semiconductor chip CP2 are bonded, the die bonding material DB is cured to fix the semiconductor chip CP1 to the die pad DP1 and the semiconductor chip CP2 to the die pad DP2.

<Wire Bonding Step>

Figure 9:
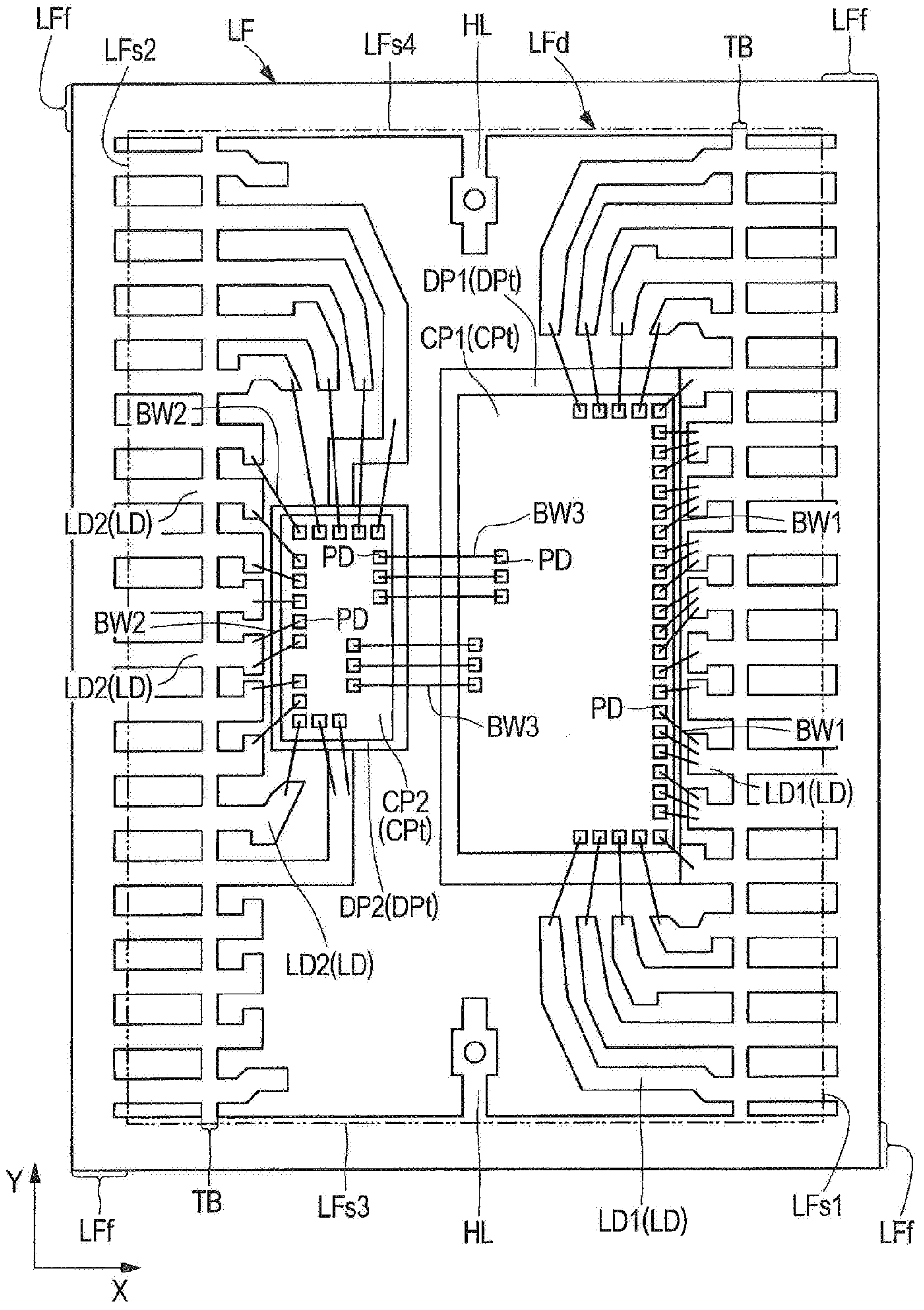
FIG. 9 is an enlarged plan view showing that the semiconductor chips shown in FIG. 8 are coupled to a plurality of leads by wires and the semiconductor chips are intercoupled by wires.

In the subsequent wire bonding step shown in FIG. 5, as shown in FIG. 9, the pads PD formed over the front surfaces CPt of the semiconductor chips CP1 and CP2 are electrically coupled to the leads LD provided around the die pad DP1 and the die pad DP2 by the wires (conductive members) BW1 and BW2, respectively. FIG. 9 is an enlarged plan view showing that the semiconductor chips and the leads shown in FIG. 8 are intercoupled by the wires and the semiconductor chips are intercoupled by wires.

In this step, one end of each of the wires BW1 made of a metal material such as gold (Au) or copper (Cu) is bonded to the pad PD of the semiconductor chip CP1 by using an unshown wire bonding tool. The other end of the wire BW1 is bonded to the inner lead part ILD (see FIG. 3) of the lead LD1. Similarly, one end of each of the wires BW2 made of a metal material such as gold (Au) or copper (Cu) is bonded to the pad PD of the semiconductor chip CP2 and the other end of the wire BW2 is bonded to the inner lead part ILD (see FIG. 3) of the lead LD2.

As the bonding system, for example, system in which ultrasonic waves are applied to a coupling part to form metal bonding, thermal compression system or system in which ultrasonic waves and thermal compression are combined may be employed.

The high-voltage circuit CHV shown in FIG. 1 is electrically coupled to the leads LD1 by electrically coupling the pads PD of the semiconductor chip CP1 to the leads LD1 by the wires BW1. The low-voltage circuit CLV shown in FIG. 1 is electrically coupled to the leads LD2 by electrically coupling the pads PD of the semiconductor chip CP2 to the leads LD2 by the wires BW2.

In this embodiment, as described with reference to FIG. 1, the coupling circuit CCOP1 and the receiving circuit Rx of the semiconductor chip CP1 are intercoupled by the wires BW3, and the coupling circuit CCOP2 and the receiving circuit Rx of the semiconductor chip CP2 are intercoupled by the wires BW3. Therefore, in this step, as shown in FIG. 9, the pads PD of the semiconductor chip CP1 and the pads PD of the semiconductor chip CP2 are electrically intercoupled by the wires BW3. As shown in FIG. 1, the high-voltage circuit CHV and the low-voltage circuit CLV are kept electrically insulated from each other.

<Sealing Step>

Figure 10:
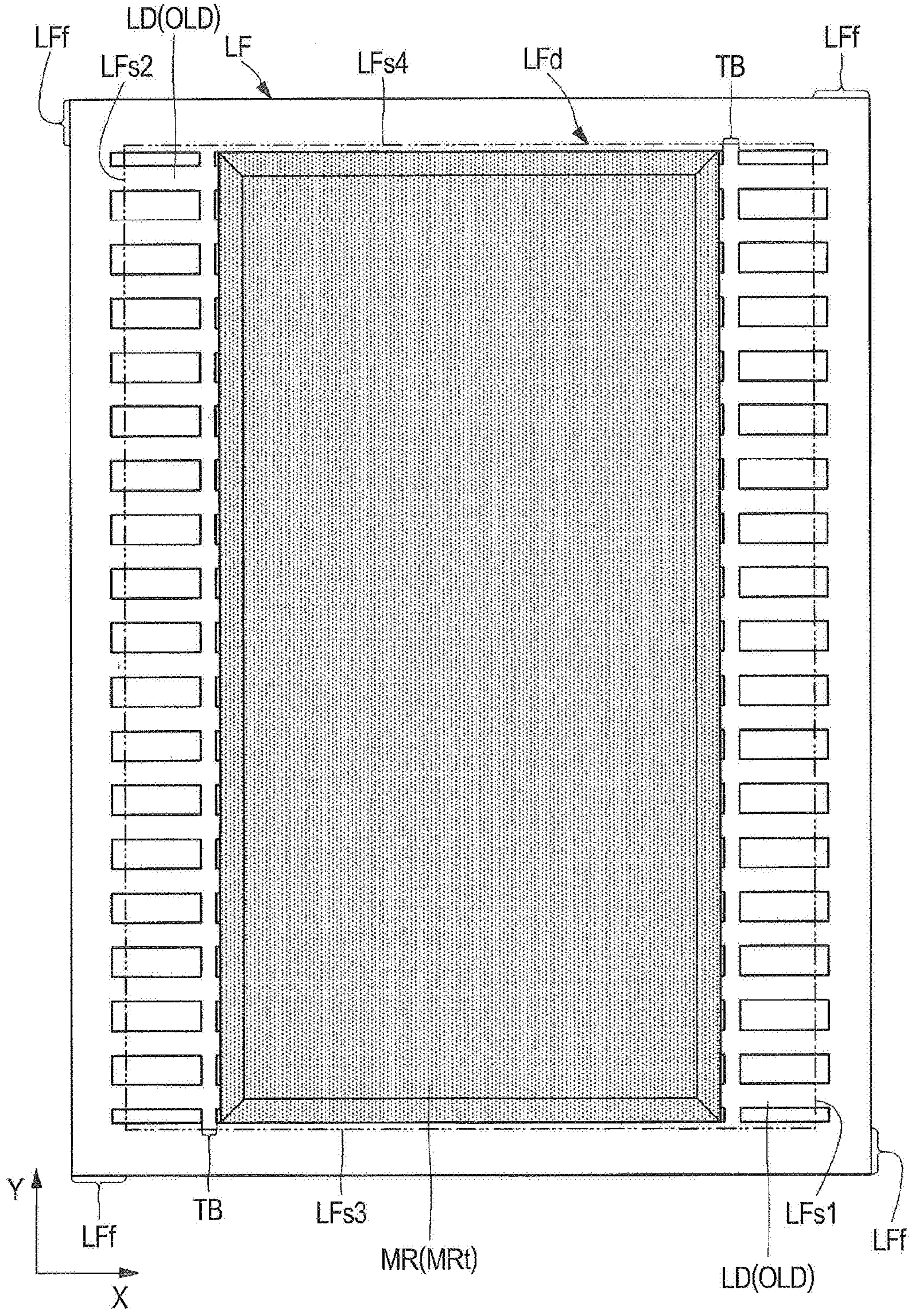
FIG. 10 is an enlarged plan view showing that a sealing body for sealing semiconductor chips is formed in a device area shown in FIG. 9.

In the subsequent sealing step shown in FIG. 5, the semiconductor chips CP1 and CP2, the wires BW1, BW2 and BW3 and the inner lead parts ILD (see FIG. 3) of the leads LD shown in FIG. 9 are sealed by a resin to form the sealing body MR shown in FIG. 10. FIG. 10 is an enlarged plan view showing that the sealing body for sealing the semiconductor chips is formed in the device area shown in FIG. 9.

In this step, after a resin is supplied into spaces formed by a plurality of cavities while the lead frame LF is installed in a metal mold having the cavities which will be described hereinafter, the above resin is cured to form the sealing body (sealing section) MR. The method of forming this sealing body MR is called “transfer mold system”.

In an example shown in FIG. 10, each of the cavities of the mold is placed in an area surrounded by the tie bars TB of each device area LFd in plan view. Therefore, the body part of the sealing body MR is formed in the area surrounded by the tie bars TB of each device area LFd as shown in FIG. 10. Part of the resin leaked from the cavity is dammed by the tie bars TB. Therefore, the outer lead parts OLD of the leads LD are exposed from the sealing body MR.

<Plating Step>

In the subsequent plating step shown in FIG. 5, the metal film MC (see FIG. 3) is formed over the exposed surfaces of the leads LD shown in FIG. 10 by plating. The metal film MC used in this step is formed to make a solder material which electrically couples the leads LD to the respective terminals of the mounting substrate easily wet to the leads LD when the semiconductor device PKG1 is mounted over an unshown mounting substrate.

In this step, the metal film MC (see FIG. 3) made of solder is preferably formed over the exposed surfaces of the leads LD. To form the metal film MC, an electroplating method in which an ionized metal ion is deposited over the exposed surfaces of the leads LD may be employed. Electroplating is preferred because the film quality of the metal film MC can be easily controlled by controlling a current at the time of forming the metal film MC. Further, electroplating is also preferred because it can shorten the time of forming the metal film MC.

<Lead Cutting Step>

In the subsequent lead cutting step shown in FIG. 5, as shown in FIG. 3, the outer lead parts OLD of the leads LD are cut off, and the leads LD are cut away from the lead frame LF (see FIG. 10). In this embodiment, after the leads LD are cut off, a plurality of leads LD are formed and curved as shown in FIG. 3.

In this step, the tie bars TB (see FIG. 10) coupling the leads LD are cut. The leads LD are separated from the frame part LFf (see FIG. 10). Thereby, the leads LD become members (independent members) separated from one another. After the leads LD are cut, the sealing body MR and the leads LD are supported to the frame part LFf by suspension leads HL (see FIG. 9).

In this embodiment, the tie bars TB are cut after the above plating step. Alternately, after only the tie bars TB are first cut, the plating step may carried out and then the leads LD may be separated from the frame part LFf. Thereby, the metal film MC can also be formed over the cut surfaces of the tie bars TB so that the discoloration of the cut surfaces of the tie bars TB by oxidation can be suppressed. Since the plating step is carried out before the leads LD are separated from the frame part LFf, the deformation of the leads LD by a plating solution can also be suppressed.

The leads LD and the tie bars TB are cut by pressing with a cutting mold which will be described hereinafter. The leads LD after cutting can be molded as shown in FIG. 3 by curving the outer lead parts OLD, for example, by pressing with an unshown metal mold.

<Dividing Step>

In the subsequent dividing step shown in FIG. 5, the suspension leads HL (see FIG. 9) are cut off to separate the semiconductor packages in the device areas LFd from one another. In this step, the resin remaining at the edges of the suspension leads HL and the sealing body MR are cut away to obtain the semiconductor device PKG1 (body to be inspected which is a semiconductor package before the inspection step) which is a semiconductor package shown in FIG. 2. As for the cutting method, cutting may be carried out by pressing with an unshown cutting mold like the above lead forming step.

<Inspection Step>

In the subsequent inspection step shown in FIG. 5, a semiconductor device which has undergone required inspection and tests such as appearance inspection and an electrical test and has passed them becomes the semiconductor device PKG1 which is a finished product shown in FIG. 2. Although there are various patterns of inspection items included in the inspection step for each product, for example, the above electrical tests include a test for confirming that the semiconductor package has no circuit disconnection or has predetermined electric properties (allowable values or more) by applying a current to the semiconductor package.

In this embodiment, out of the above electrical tests, an insulation withstand voltage test in which a test voltage is applied between the high-voltage circuit CHV and the low-voltage circuit CLV to test insulation properties between the high-voltage circuit CHV and the low-voltage circuit CLV will be described hereinbelow.

<Test Device>

Figure 11:
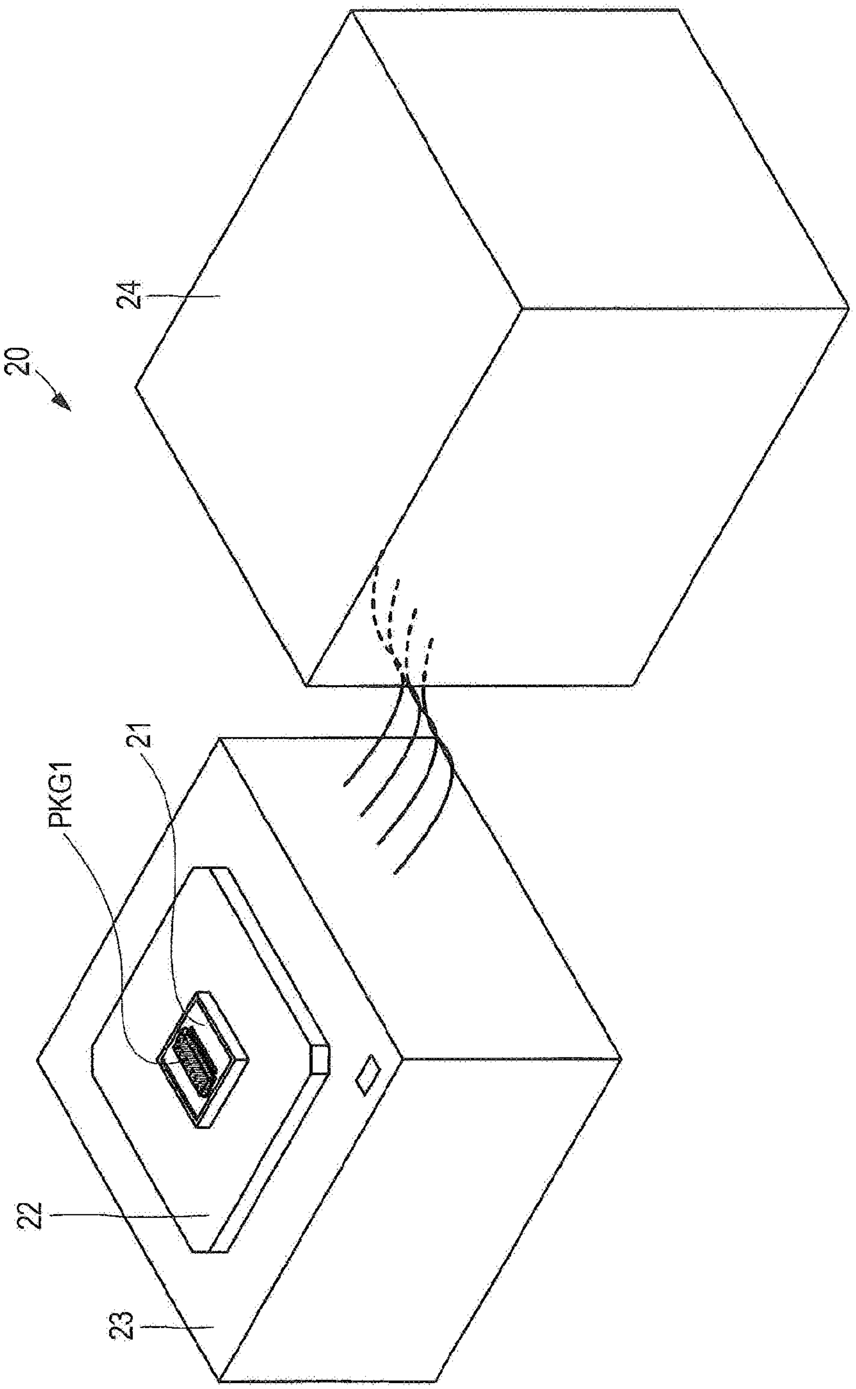
FIG. 11 is a schematic diagram showing the configuration of a test device for carrying out an inspection step shown in FIG. 5.
Figure 12:
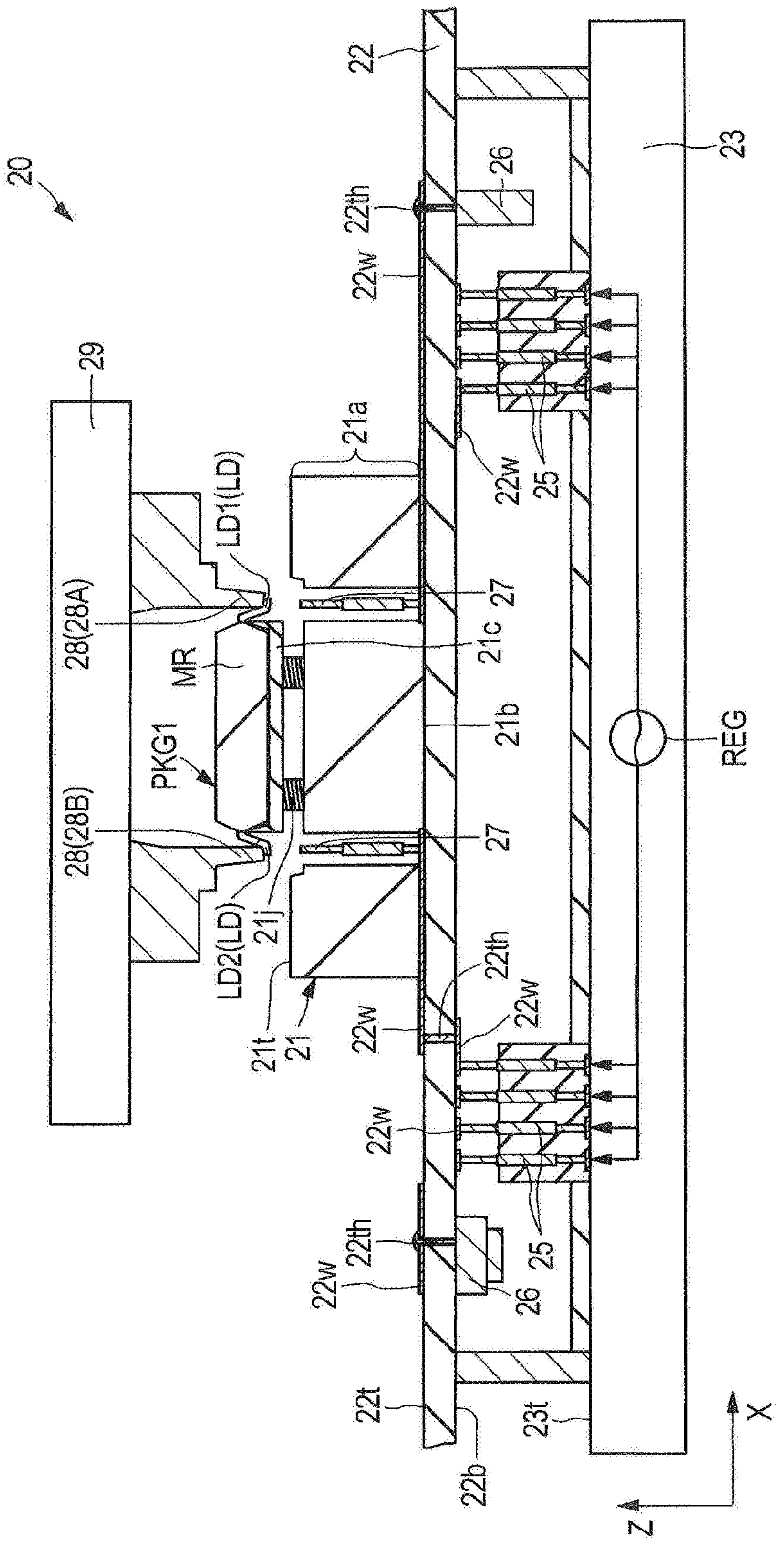
FIG. 12 is an enlarged sectional view of a key part around the socket of the test device shown in FIG. 11.
Figure 13:
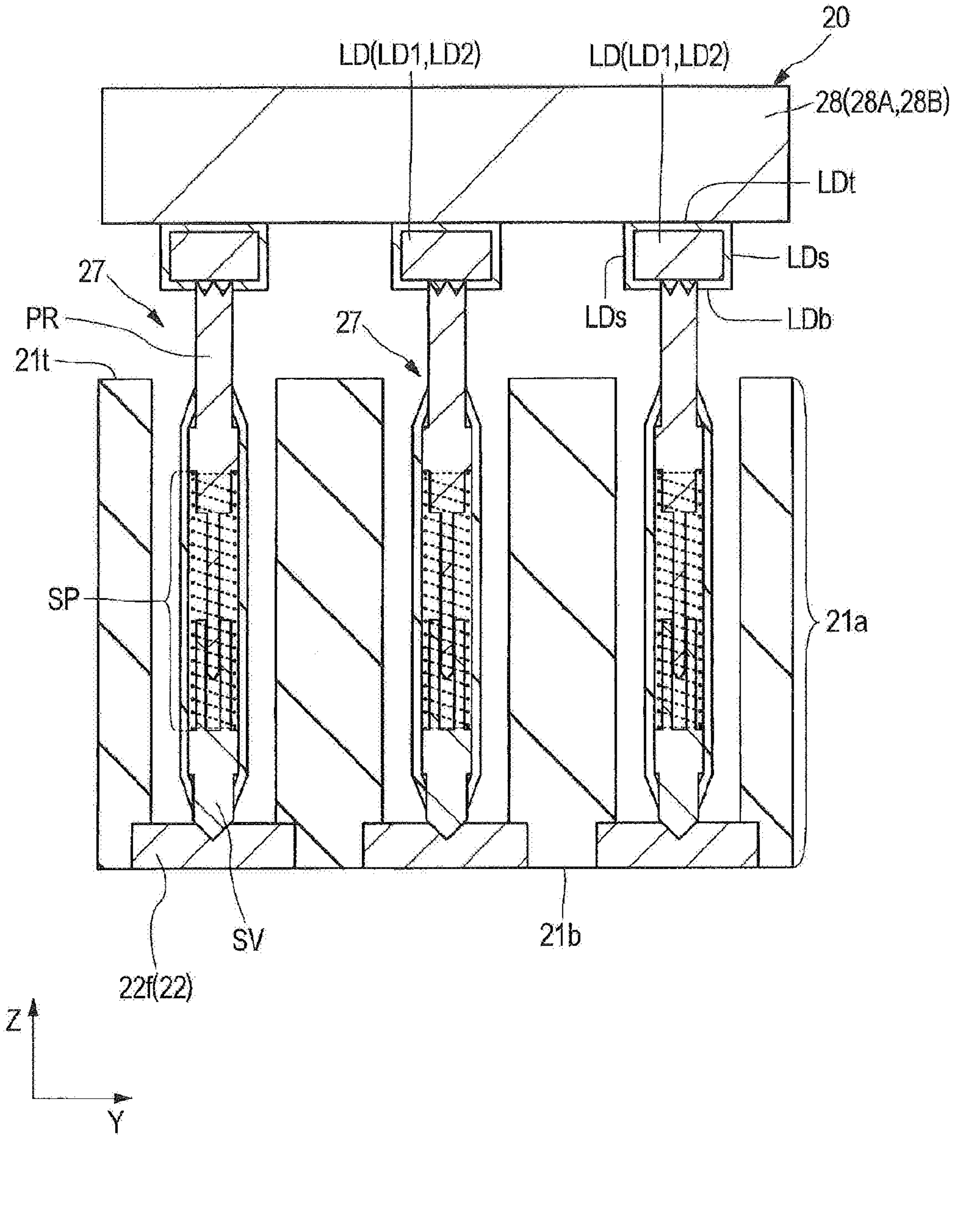
FIG. 13 is an enlarged sectional view of an area around coupling parts between the test terminals and the leads shown in FIG. 12.

A description is first given of the configuration of a test device (inspection device) for carrying out an electrical test on an object to be inspected which is a semiconductor package in the inspection step shown in FIG. 5. In the following description, the semiconductor device PKG1 is an object to be inspected until the inspection step shown in FIG. 5 is completed. However, when the above dividing step is completed, the object has the same structure as the semiconductor device PKG1 which is a finished product explained with reference to FIGS. 1 to 4. Therefore, the object to be inspected will be referred to as “semiconductor device PKG1” in the following description. FIG. 11 is a schematic diagram showing the configuration of a test device for carrying out the inspection step shown in FIG. 5, and FIG. 12 is an enlarged sectional view of a key part around the socket of the test device shown in FIG. 11. FIG. 13 is an enlarged sectional view of an area around coupling parts between the test terminals and the leads shown in FIG. 12

A test device (electrical test device, inspection device, tester) 20 for carrying out an electrical test on the semiconductor device PKG1 in the inspection step of this embodiment has a socket (storage part) 21 for storing the semiconductor device PKG1, a test substrate (wiring substrate, performance board) 22 which is electrically coupled to the semiconductor device PKG1 through the socket and a test head 23 which is electrically coupled to the test substrate 22. A test circuit for inputting and outputting a signal or a test voltage into and from the semiconductor device PKG1 is formed in the test head 23 and electrically coupled to the semiconductor device PKG1 through the test substrate 22 and the socket 21.

In this embodiment, a control part (tester body) 24 is arranged next to the test head 23 and electrically coupled to the test head 23. A control circuit for controlling (for example, relative position control between the test head 23 and the semiconductor device PKG1 or control for continuously testing a plurality of semiconductor devices PKG1) the electrical test step is formed in the control part 24. The position for forming the control circuit is not limited to the position shown in FIG. 11 and may be formed in the test head 23 as a variation.

As shown in FIG. 12, the test head 23 has a top surface 23*t* which is a substrate mounting surface for mounting the test substrate 22, and the test substrate 22 is fixed over the top surface 23*t* of the test head 23. The test substrate 22 is electrically coupled to the test circuit formed in the test head 23 through a plurality of connector terminals (terminals) 25 arranged over the top surface 23*t* of the test head 23.

The test substrate 22 is a wiring substrate having a top surface 22*t* for mounting the socket 21 and a rear surface 22*b* on the opposite side to the top surface 22*t*. A wiring pattern composed of a plurality of wires 22*w* is formed over the top surface 22*t* and the rear surface 22*b*.

The wires 22*w* formed on the top surface 22*t* side and the wires 22*w* formed on the rear surface 22*b* side are electrically coupled to each other through transmission paths (interlayer conduction paths) 22*th* such as through holes extending from the top surface 22*t* to the rear surface 22*b* of the test substrate 22. A plurality of electronic parts 26 such as a capacitor and a coil are mounted over the test substrate 22 and electrically coupled to the socket 21 mounted over the top surface 22*t* side through the wires 22*w*. In the example shown in FIG. 12, the electronic parts 26 are mounted over the rear surface 22*b*. The test substrate 22 is fixed above the test head 23 with a space therebetween in such a manner that the rear surface 22*b* is opposed to the top surface 23*t* of the test head 23. Although the method of fixing the test substrate is not limited, for example, the test substrate is screwed to the test head 23.

The socket 21 for fixing the semiconductor device PKG1 is fixed to the socket fixing area over the top surface 22*t* of the test substrate 22. Although the method of fixing the socket 21 is not particularly limited, in this embodiment, the socket is screwed. Thereby, the socket can be easily attached and detached when the type of at least the semiconductor device to be measured is changed.

The socket 21 has a body part 21*a* made of an insulating material such as a resin. The body part 21*a* has a top surface (semiconductor device fixing surface) 21*t* which is a surface for fixing the semiconductor device PKG1 and an under surface (test substrate mounting surface) 21*b* on the opposite side to the top surface 21*t*.

The socket 21 is arranged on the top surface side of the body part 21*a* and has a pedestal (package fixing part, area) 21*c* for fixing and holding the semiconductor device PKG1. The periphery of this pedestal 21*c* projects from the center area of the pedestal 21*c*, and the sealing body MR of the semiconductor device PKG1 is stored on the inner side of this projecting part so that the semiconductor device PKG1 can be situated at a predetermined position. That is, the projecting part formed at the periphery of the pedestal 21*c* functions as a positioning guide for positioning the semiconductor device PKG1.

In the example shown in FIG. 12, the pedestal 21*c* is coupled to the top surface 21*t* side of the body part 21*a* through a coupling part 21*j*. The coupling part 21*j* is an elastic member which can be elastically transformed in a direction perpendicular to the top surface 21*t* of the socket 21 and a spring in the example shown in FIG. 12. Since the body part 21*a* is coupled to the pedestal 21*c* by the coupling part 21*j*, by applying pressing force to the pedestal 21*c* in the inspection step, the pedestal 21*c* is pressed toward the body part 21*a*.

The socket 21 has a plurality of test terminals (pogo pins, contact terminals, contactors) 27 which are electrically coupled to the leads LD of the semiconductor device PKG1. The test terminals 27 are inserted into a plurality of through holes formed in the body part 21*a* of the socket 21 and electrically coupled to a plurality of terminals (pogo seats) 22*f* (see FIG. 13) formed over the test substrate 22, respectively.

In the inspection step, the test terminals 27 are coupled to the under surfaces LDb (see FIG. 13) of the leads LD, respectively. Stated more specifically, each of the leads LD shown in FIG. 3 has a top surface LDt, an under surface LDb on the opposite side to the top surface LDt, and side surface LDs between the top surface LDt and the under surface LDb as shown in FIG. 13. Since the test terminals 27 shown in FIG. 12 are arranged below the leads LD, they come into contact with the under surfaces LDb of the leads LD as shown in FIG. 13. More specifically, the test terminals 27 come into contact with the under surfaces LDb (see FIG. 13) of the mounting parts OLD2 of the outer lead parts OLD which have been explained with reference to FIG. 3.

The test device 20 has a test terminal (contact terminal, contactor, batch contact terminal) 28 in contact with the top surfaces LDt of the leads LD. This test terminal 28 comes into contact with the top surfaces LDt of the leads LD in one batch. Therefore, a conductor such as a metal is exposed to at least the surface in contact with the leads LD. For example, a part entirely attached to a handler (pressing mechanism) 29 of the test terminal 28 is entirely composed of a metal member. Alternatively, when the substrate of the test terminal 28 is formed from a resin, the surface of the substrate made of a resin is covered with a metal film.

The test terminal 28 also functions as a pressing jig (lead pressing member) which presses the ends of the leads LD against the test terminals 27. Stated more specifically, the test terminal 28 is fixed to the handler 29 which is a pressing mechanism formed at a position opposite to the socket 21. The handler 29 is configured such that it can move up and down in a direction perpendicular to the top surface 21*t* of the socket 21. Therefore, when the handler 29 is moved toward the socket 21, the test terminal 28 approaches the leads LD of the semiconductor device PKG1 stored in the socket 21. Then, when the handler 29 is further lowered after the test terminal 28 comes into contact with the leads LD, pressing force is applied to the ends (mounting parts OLD2 shown in FIG. 3) of the leads LD.

In the inspection step of this embodiment, pressing force is applied to the ends of the leads LD from the test terminal 28. Thereby, the ends of the leads LD are pressed against the test terminals 27, whereby the test terminals 27 and the leads LD come into contact with each other and the test circuit and the leads are electrically coupled to each other.

As shown in FIG. 13, each of the test terminals 27 has a plunger part PR having an end to be brought into contact with the lead LD, a sleeve part SV which includes part of the plunger part PR and is located on the opposite side to the plunger part PR, and a spring part SP which is an elastic body arranged between the plunger part PR and the sleeve part SV, and is shaped like a thin bar (needle-like) as a whole. In the example shown in FIG. 13, the spring part SP is a coil spring. The plunger part PR and the sleeve part SV are made of a metal material, and the end of the sleeve part SV is in contact with the terminal 22*f* of the test substrate 22. The test terminal 27 is used as a transmission path for transmitting a signal or potential input from the terminal 22*f* to the lead LD through contacts of the plunger part PR and the sleeve part SV.

The plunger part PR has a bar-type axial part extending from the contact area (contact part) which comes into contact with the lead LD in the inspection step toward the sleeve part SV. The axial part of the plunger part PR serves to control contact load (contact pressure) between the contact area and the lead LD by transmitting elastic force applied from the spring part SP to the contact area.

The plunger part PR is configured such that the end (upper end part, end part on the opposite side to the sleeve part SV) of the contact area with the lead LD is pointed (pointed shape) in the inspection step. Thereby, part of the test terminal 27 can be intruded into the lead LD as shown in FIG. 13 in the inspection step. Stated more specifically, the pointed part of the contact area of the plunger part PR of the test terminal 27 is intruded into the metal film MC covering the surface of the lead LD. Therefore, contact resistance between the lead LD and the test terminal 27 can be reduced.

<Insulation Withstand Voltage Test>

A description is subsequently given of the inspection step using the test device 20 which has been explained with reference to FIGS. 11 to 13. In this section, an insulation withstand voltage test in which a test voltage is applied between the high-voltage circuit CHV and the low-voltage circuit CLV shown in FIG. 1 as described above to test insulation properties between the high-voltage circuit CHV and the low-voltage circuit CLV will be described hereinbelow.

Figure 14:
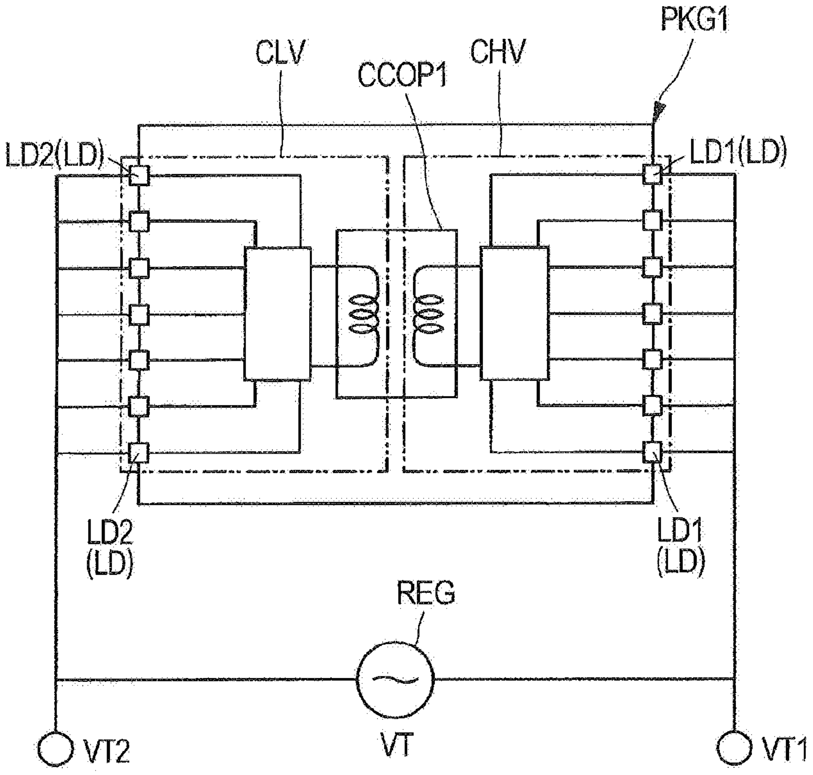
FIG. 14 is a schematic diagram of a circuit block for carrying out an insulation withstand voltage test included in the inspection step shown in FIG. 5.

FIG. 14 is a schematic diagram showing a circuit block for carrying out an insulation withstand voltage test included in the inspection step shown in FIG. 5.

In the case of a semiconductor package having the low-voltage circuit CHV and the low-voltage circuit CLV which are intercoupled (coupled) by the coupling circuit CCOP1 like the semiconductor device PKG1 of this embodiment which has been described with reference to FIG. 1, it is necessary to evaluate the insulation withstand voltage properties of the coupling circuit CCOP1.

Then, in the insulation withstand voltage test which is carried out in the inspection step of this embodiment, as shown in FIG. 14, a test voltage VT is applied between the high-voltage circuit CHD and the low-voltage circuit CLV of the semiconductor device PKG1. Thereby, the insulation withstand voltage properties of the coupling circuit CCOP1 which intercouples the high-voltage circuit CHV and the low-voltage circuit CLV can be tested.

In the insulation withstand voltage test, a potential VT1 on the high voltage side is supplied to the leads LD1 coupled to the high-voltage circuit CHV whereas a potential VT2 on the low voltage side is supplied to the leads LD2 coupled to the low-voltage circuit CLV. In the example shown in FIG. 14, an AC power source is used as a power source REG. There are variations of the test voltage VT and the application time, for example, an AC of 3 kV is applied for 2 seconds.

The potential VT2 on the low voltage side is an AC reference potential. When a reference potential, for example, a ground potential is supplied as the potential VT2, the absolute value of the potential VT1 is larger than the value of the potential VT2. When a DC power source is used as the power source REG as a variation of FIG. 14, the value of the potential VT1 is larger than the value of the potential VT2.

Figure 20:
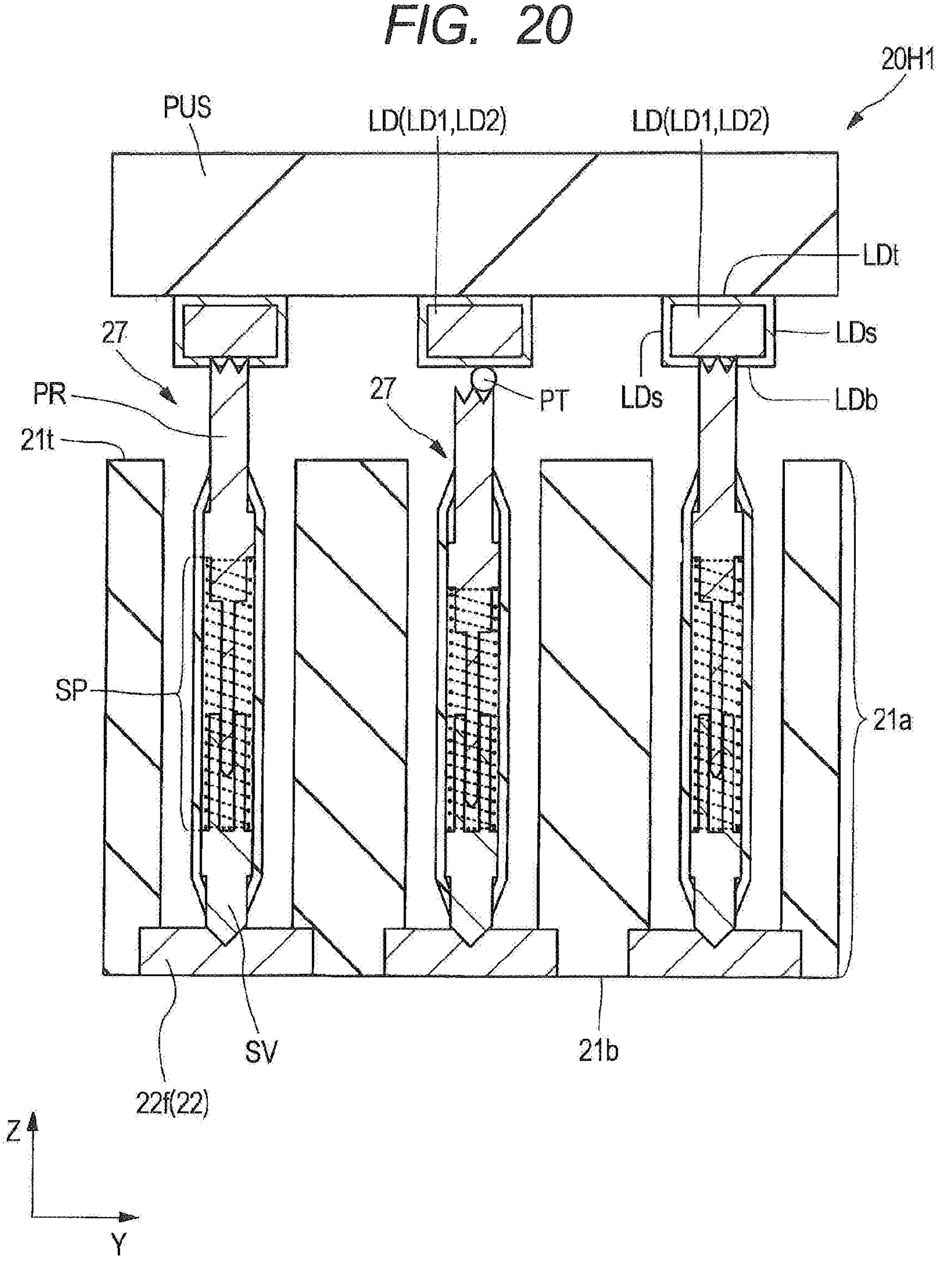
FIG. 20 is an enlarged sectional view of a study example for FIG. 13.

The inventors of the present application studied an insulation withstand voltage test using a test device 20H1 for supplying a potential only from the test terminals 27 in contact with the under surfaces LDb of the leads LD1 by installing an insulating pressing member PUS over the top surfaces LDt of the leads LD1 as in a study example shown in FIG. 20.

As a result, they found that when a potential is supplied only from the test terminals 27 in contact with the under surfaces LDb of the leads LD, a test potential may not be supplied to some of the leads LD. For example, as shown in FIG. 20, when insulating foreign matter PT is sandwiched between the plunger part PR of the test terminal 27 and the lead LD, the test terminal 27 may not come into contact with the lead LD. Also, when some of the test terminals 27 do not operate properly due to deterioration, some of the test terminals 27 may not come into contact with the leads LD.

When the same potential VT1 (see FIG. 14) is supplied to the leads LD as in the insulation withstand voltage test, if the potential VT1 is not supplied to some of the leads LD, the test can be carried out.

However, a high voltage, for example, 3 kV is applied in the insulation withstand voltage test as described above. Therefore, when some of the test terminals 27 do not come into contact with the leads LD1, the potential difference between the leads LD1 and the test terminals 27 which are separated from each other becomes large, whereby a spark may occur. When a spark occurs between the leads LD and the test terminals 27, the test device 20H1 and the semiconductor device PKG1 are damaged.

Then, the inventors of the present application conducted studies in order to supply the potential VT1 to the leads LD1 surely and found this embodiment.

That is, as shown in FIG. 13, the test device 20 of this embodiment has the test terminals 27 which are provided along the arrangement direction (Y direction in FIG. 13) of the leads LD and the test terminal 28 which is provided across the test terminals 27 along the above arrangement direction at a position opposite to the test terminals 27. In the insulation withstand voltage test, the under surfaces LDb of the leads LD1 are brought into contact with the test terminals 27, respectively, and the top surfaces LDt of the leads LD1 are brought into contact with the test terminal 28. The potential VT1 (see FIG. 14) is supplied to the test terminals 27 and the test terminal 28.

When one test terminal 28 is brought into contact with the leads LD1 as in this embodiment, a plurality of routes for supplying the potential VT1 to the test terminal 28 are provided. Therefore, it is possible to supply the potential VT1 to the test terminal 28 almost surely. Even when some of the test terminals 27 are not in contact with the leads LD1, if the leads LD1 are in contact with the test terminal 28, the potential VT1 can be supplied to the leads LD1. As a result, since the potential VT1 can be supplied to the leads LD1, the occurrence of a spark between some of the leads LD1 and the test terminals 27 or the test terminal 28 can be suppressed.

The insulation withstand voltage test included in the inspection step of this embodiment can be expressed as follows. That is, the insulation withstand voltage test included in the inspection step of this embodiment includes the step of sandwiching the leads LD1 between the test terminals 27 provided on the under surface LDb side of the leads LD1 and the test terminal 28 provided on the top surface LDt side of the leads LD1. The insulation withstand voltage test of this embodiment includes the step of supplying the potential VT1 to the test terminals 27 and the test terminal 28.

The test terminal 28 of this embodiment functions as a pressing jig which presses the ends of the leads LD against the test terminals 27 as described above. In other words, the inspection step of this embodiment includes the step of pressing the leads LD1 while the test terminal 28 is in contact with the top surfaces LDt of the leads LD1. Therefore, the leads LD1 tend to come into contact with at least the test terminals 27 or the test terminal 28.

Figure 15:
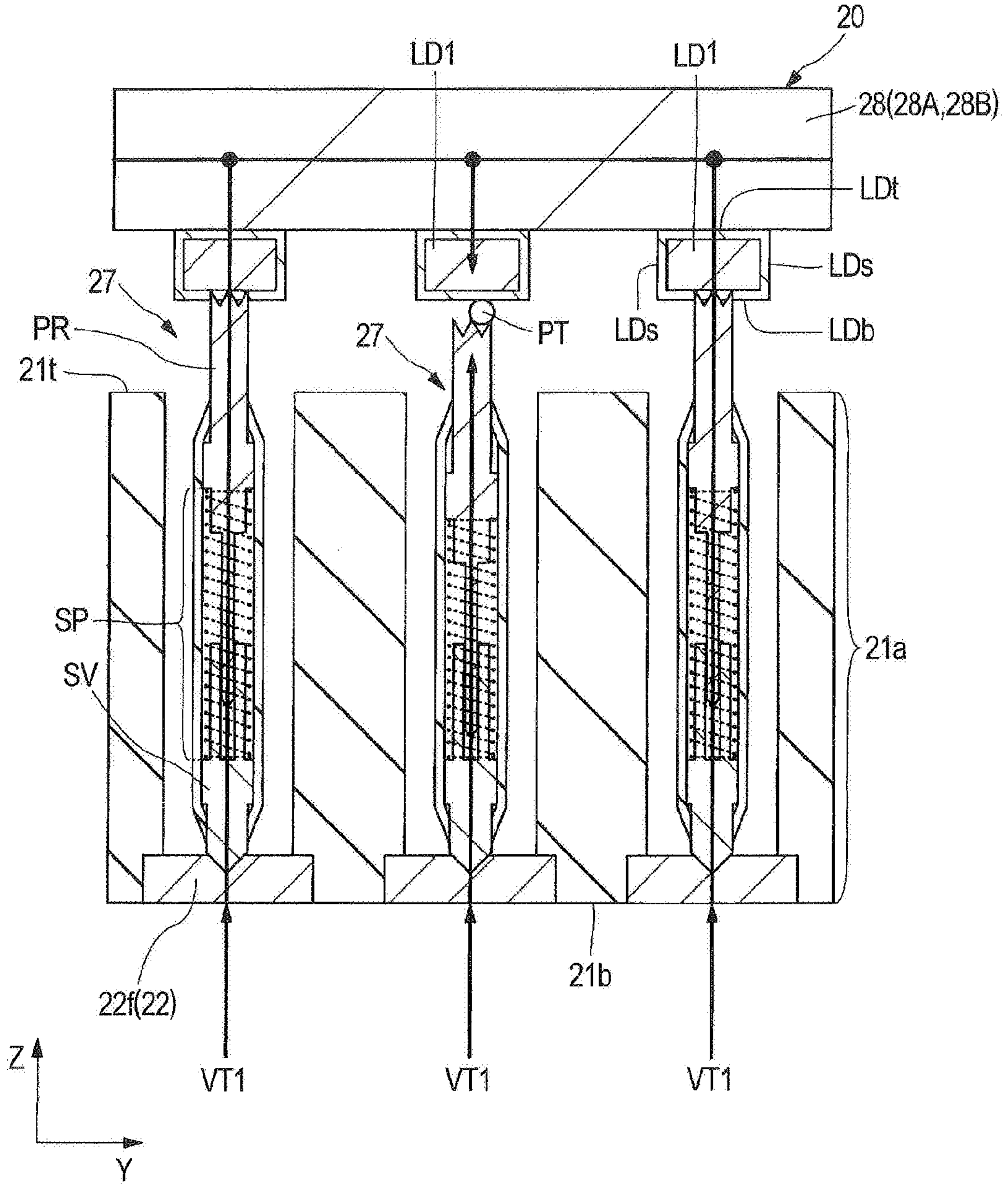
FIG. 15 is a schematic diagram showing a potential flow when foreign matter adheres to one of the terminals shown in FIG. 13.

The mechanism that the occurrence of a spark is suppressed in the insulation withstand voltage test of this embodiment will be explained with reference to FIG. 15. FIG. 15 is a schematic diagram showing a potential flow when foreign matter adheres to one of the terminals shown in FIG. 13.

In the insulation withstand voltage test of this embodiment, as shown in FIG. 12, the semiconductor device PKG1 is mounted over the pedestal 21*c* of the socket 21. Then, the handler 29 to which the test terminals 28 are fixed is lowered toward the socket 21 so as to bring the ends of the test terminals 28 into contact with the leads LD. The test terminals 28 which are electrically separated from one another are fixed to the handler 29, a test terminal 28A out of the test terminals 28 comes into contact with the leads LD1, and a test terminal 28B comes into contact with the leads LD2. As described above, the test terminal 28A and the test terminal 28B come into contact with the top surfaces LDt (see FIG. 13) of the mounting parts OLD2 of the outer lead parts OLD of the leads LD shown in FIG. 3.

Thereafter, when the handler 29 is further lowered, pressing force is applied from the test terminals 28 to the leads LD. This pressing force is transmitted to the pedestal 21*c* holding the semiconductor device PKG1 to compress the spring of the coupling part 21*j* therewith. As a result, the pedestal 21*c* is lowered toward the body part 21*a* of the socket 21, whereby the ends of the test terminals 27 come into contact with the under surfaces LDb of the leads LD as shown in FIG. 13. When the operation of the handler 29 (see FIG. 12) is stopped after that, the test terminals 28 come into contact with the top surfaces LDt of the leads LD, thereby obtaining contact between the test terminals 27 and the under surfaces LDb of the leads LD. Contact force between the test terminals 27 and the leads LD and contact force between the test terminals 28 and the leads LD are controlled by the height of the handler 29 shown in FIG. 12, the elastic force of the spring of the coupling part 21*j* and the elastic force of the spring parts SP of the test terminals 27.

At this point, when insulating foreign matter PT adheres to the end of one of the test terminals 27 as shown in FIG. 15 and is sandwiched between the test terminal 27 and the lead LD1, the test terminal 27 to which the foreign matter PT adheres may not come into contact with the lead LD1.

When the potential VT1 is supplied to the test terminals 27 in this state, the potential VT1 is supplied to the test terminal 28 through the test terminals 27 to which the foreign matter PT does not adhere and the leads LD1. As shown in FIG. 15, the test terminal 27 to which the foreign matter PT adheres is not in contact with the lead LD1 whereas the lead LD1 separated from the test terminal 27 is in contact with the test terminal 28. Therefore, the potential VT1 is also supplied to the lead LD1 separated from the test terminal 27.

A discharge phenomenon is a phenomenon that a breakdown occurs between electrodes by applying a high voltage between separated electrodes. Therefore, even when the lead LD1 and the test terminal 27 separated from each other are existent as in this embodiment, if the same potential is supplied to the lead LD1 and the test terminal 27 and the potential is high, the discharge phenomenon does not occur. That is, according to this embodiment, the occurrence of a spark can be suppressed.

According to the testing method of this embodiment, although the possibility of the occurrence of a spark can be significantly reduced, it is difficult to eliminate this possibility completely. For example, when insulating foreign matter adheres to the top surface LDt of the lead LD1 separated from the test terminal 27, it is possible that a spark may occur in the lead LD1 not in contact with the test terminal 27 and the test terminal 28. Then, it is preferred that, before the insulation withstand voltage test is carried out, that is, the high potential VT1 is supplied, a lower potential than that of the insulation withstand voltage test should be supplied to carry out a continuity test.

As shown in FIG. 14, in the insulation withstand voltage test of this embodiment, the potential VT2 on the low voltage side is supplied to the leads LD2 coupled to the low-voltage circuit CLV. When the potential VT2 is a ground voltage or sufficiently low, if some of the leads LD2 are not in contact with the test terminals 27, a spark does not occur. Therefore, as for the structure of the test terminals 27 to be brought into contact with the leads LD2, as shown in FIG. 20, the insulating pressing member PUS may be formed over the top surfaces LDt of the leads LD2 and a potential may be supplied only from the test terminals 27 in contact with the under surfaces LDb of the leads LD1. In this case, as the material of the pressing member PUS is not limited to a conductive material, the degree of freedom of selecting the material is enhanced.

That is, as shown in FIG. 20, each of the leads LD2 has a top surface LDt and an under surface LDb on the opposite side to the top surface LDt. A part in contact with the leads LD2 of the test device 20 shown in FIG. 12 has a plurality of test terminals 27 arranged along the arrangement direction of the leads LD2 like the test device 20H1 shown in FIG. 20. The test device 20 may have an insulating pressing member PUS which is provided across the test terminals 27 along the arrangement direction at a position opposite to the test terminals 27 like the test device 20H1 shown in FIG. 20. A variation of the insulation withstand voltage test step may include the step of making the handler 29 shown in FIG. 12 approach the socket 21 to bring the leads LD2 and the leads LD1 of the semiconductor device PKG1 into contact with the handler 29 and the pressing member PUS into contact with the leads LD2 of the semiconductor device PKG1. Another variation of the insulation withstand voltage test includes the step of applying pressing force from the test terminal 28A to the leads LD1 to bring the leads LD1 into contact with the test terminals 27 and applying pressing force from the pressing member PUS to the leads LD2 to bring the leads LD2 into contact with the test terminals 27 after the above step.

Meanwhile, when the value of the potential VT2 used as a reference voltage is high and the occurrence of a spark is worried about, as shown in FIG. 13, preferably, the test terminals 27 and the test terminal 28 are brought into contact with the leads LD2. That is, as shown in FIG. 12, it is preferred that test terminals 28B composed of a conductive member should be installed and the potential VT2 shown in FIG. 14 should be supplied to the test terminals 27 and the test terminals 28B. Thereby, like the suppression of the occurrence of a spark in the leads LD1, the occurrence of a spark in the leads LD2 can be suppressed, As a matter of course, when the potential VT2 is a ground potential, as shown in FIG. 13, the test terminals 27 and the test terminals 28 may be brought into contact with the leads LD2. In this case, when the test terminals 28A and the test terminals 28B shown in FIG. 12 are made the same in structure, spare parts can be used for both terminals.

When the leads LD are pressed by the test terminals 28 as in this embodiment, it is preferred that the deterioration of the flatness of the contact surfaces with the leads LD should be suppressed. Therefore, the material configuring the test terminals 28 is preferably a material having high abrasion resistance. Meanwhile, it may be difficult to manufacture the test terminals entirely from a material having high abrasion resistance.

Figure 16:
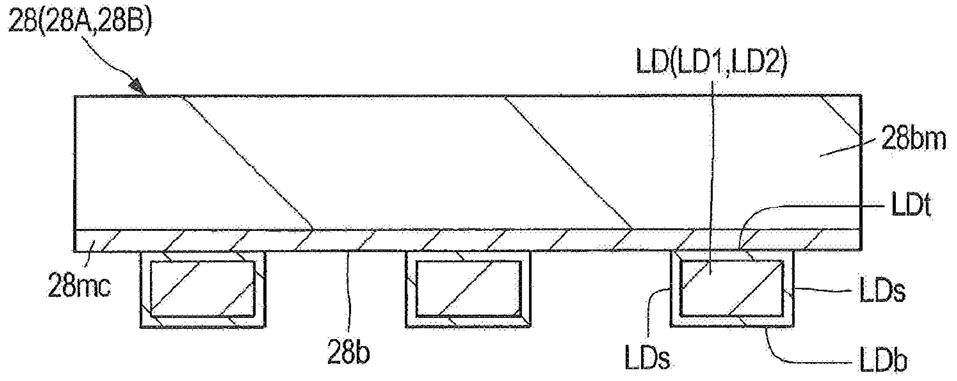
FIG. 16 is an enlarged sectional view of a variation of the test terminal shown in FIG. 13.

Then, like a variation shown in FIG. 16, it is preferred that a metal film 28*mc* should be formed over the contact surfaces 28*b* with the top surfaces LDt of the leads LD of the test terminals 28. The metal film 28*mc* is formed from a material harder than a substrate 28*bm*. For example, the metal film mc has a Vickers hardness of 900 to 1,000 Hv. Since the metal film 28*mc* hardly wears away thereby, the test terminals 28 can be used repeatedly. As the metal film having the above properties, a Ni (nickel) film formed by adding B (boron) as an impurity is used.

<Variations>

While the invention which was made by the inventors has been described in detail based on an embodiment thereof, it is needless to say that the invention is not limited thereto and variations may be made without departing from the spirit or scope of the invention. Having described some variations of the above embodiment, typical variations except for the variations described in the section of the embodiment will be described hereinbelow.

For example, in the above embodiment, the insulation withstand voltage test has been described as an example of a test in which the same potential is supplied to adjacent leads LD1. However, the present invention can be applied to various tests besides the insulation withstand voltage test if they are electrical tests in which the same potential is supplied to adjacent leads LD1.

For example, when the same potential is supplied to adjacent leads LD and the resistance value in the supply route of the potential is tested, if the potential is not supplied to some of the leads, the resistance value cannot be measured properly. Then, as described in the above embodiment, the test terminals 27 and the test terminals 28 are provided to supply the same potential to the adjacent leads LD, thereby making it possible to prevent a failure to supply a potential to some of the leads.

For example, in the above embodiment, the terminals 27 are brought into contact with the leads LD, respectively. However, when only a test in which the same potential is supplied to the leads LD is taken into consideration, the leads LD may be sandwiched between test terminals having the same structure as the test terminals 28 shown in FIG. 13.

From the following point of view, to bring the test terminals 27 and 28 into contact with the leads LD as in the above embodiment, the test terminals 27 are preferably brought into contact with the leads LD, respectively. That is, in the case of the test device 20 (see FIG. 13) having the test terminals 27 which are brought into contact with the leads LD, respectively, a test in which different signals are supplied to the respective leads LD can also be conducted. In this case, a test is carried out by replacing the test terminals 28 fixed to the handler 29 by the insulating pressing member PUS shown in FIG. 20. Therefore, a plurality of electrical tests can be carried out with the single test device 20 in the inspection step.

When the test terminals 27 are brought into contact with the leads LD, respectively, appropriate contact pressure can be applied to the leads LD. Therefore, even when the leads LD vary in height, contact pressure applied to the leads LD can be controlled to a value within an appropriate range.

Figure 17:
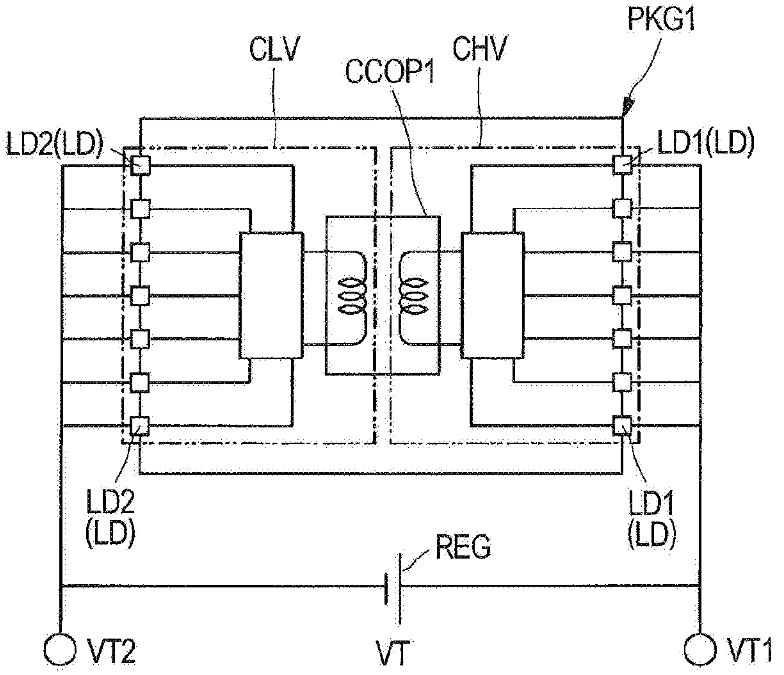
FIG. 17 is a diagram showing the circuit block of the variation of FIG. 14.

In the above embodiment, as shown in FIG. 14, an AC power source is used as the power source REG for the insulation withstand voltage test. However, as shown in FIG. 17, a DC power source may be used as the power source REG. In this case, the potential VT1 and the potential VT2 are fixed potentials, and the value of the potential VT1 is larger than the value of the potential VT2.

In the above embodiment, the test terminals 28 are not coupled to independent wires, and a conductive member is simply fixed to the handler 29. However, as a variation, the test terminals 28 may be coupled to wires so as to supply the potential VT2 and the potential VT1 shown in FIG. 14 through the wires. In this case, the potential can be supplied to the test terminals 28 surely.

Meanwhile, when the test terminals 28 are not coupled to the wires and a potential is supplied through the leads LD as in the above embodiment, the wiring structure can be simplified.

In the above embodiment, as shown in FIG. 14, the potential VT1 is supplied to all of the leads LD1 and the potential VT2 is supplied to all of the leads LD2. However, as a variation, the leads shown in FIG. 2 may include a lead LD to which a test voltage VT shown in FIG. 14 is not supplied.

Figure 18:
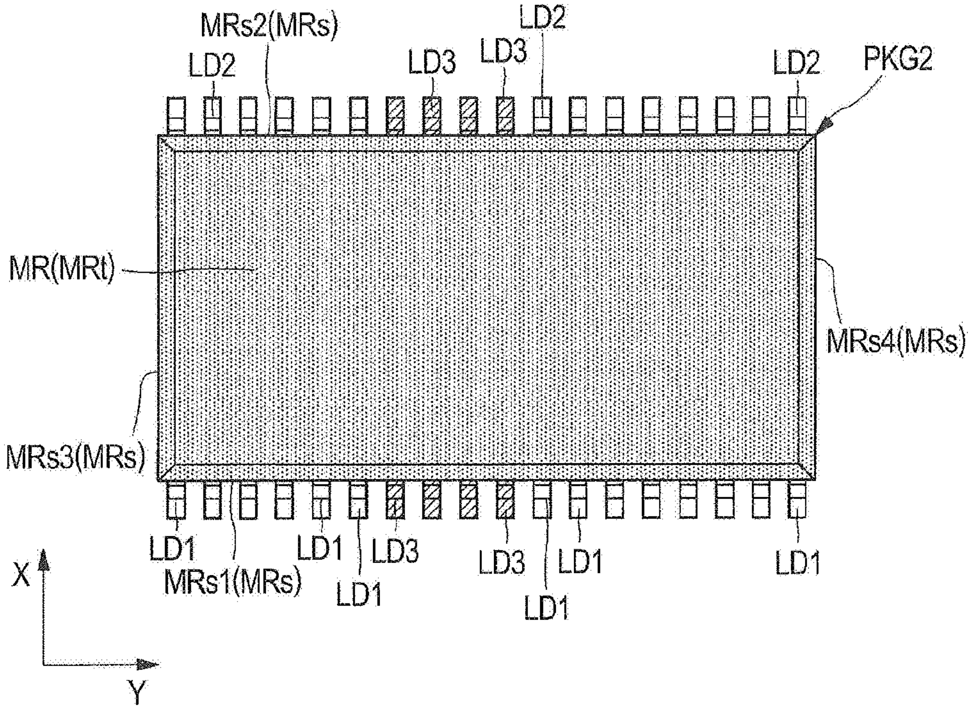
FIG. 18 is a plan view showing a variation of the semiconductor device shown in FIG. 2.
Figure 19:
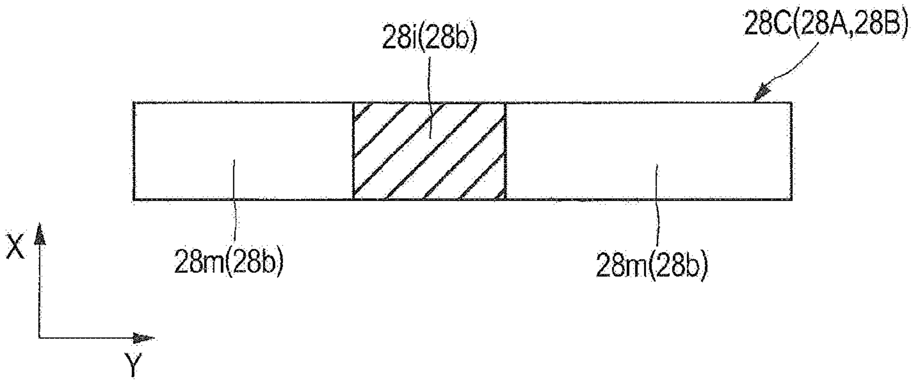
FIG. 19 is a plan view of the contact surface of a test terminal used in the electrical test of the semiconductor device shown in FIG. 18.

FIG. 18 is a plan view of a variation of the semiconductor device shown in FIG. 2. FIG. 19 is a plan view of the contact surface of a test terminal used in the electrical test of the semiconductor device shown in FIG. 18. Although FIG. 18 and FIG. 19 are plan views, parts thereof are hatched to clearly show the differences in type and constituent material between the leads LD. In FIG. 18, leads to which a test voltage is not applied in the insulation withstand voltage test are hatched. In FIG. 19, an insulation part 28*i* made of an insulating material of the contact surface 28*b* of a test terminal 28C is hatched.

A semiconductor device PKG2 shown in FIG. 18 differs from the semiconductor device PKG1 shown in FIG. 2 in that leads exposed from the side surface MRs1 of the sealing body MR include leads LD3 to which a test voltage is not applied in the insulation withstand voltage test. Further, the semiconductor device PKG2 differs from the semiconductor device PKG1 shown in FIG. 2 in that the leads exposed from the side surface MRs2 of the sealing body MR include leads LD3 to which a test voltage is not applied in the insulation withstand voltage test.

To carry out the insulation withstand voltage test on the semiconductor device PKG2, the test terminals 28C shown in FIG. 19 should be used in place of the test terminals 28 shown in FIG. 13. The test terminals 28C differ from the test terminals 28 shown in FIG. 13 in that the contact surface 28*b* has a conductive part 28*m* made of a conductive material and the insulating part 28*i* made of an insulating material.

In the insulation withstand voltage test using the test terminals 28C, the conductive part 28*m* comes into contact with the leads LD1 shown in FIG. 18. The insulating part 28*i* comes into contact with the leads LD3 shown in FIG. 18. Thereby, even when leads LD to which a high voltage cannot be applied are arranged adjacent to each other, the insulation withstand voltage test can be conducted.

For example, in the above embodiment, a SOP type semiconductor device has been described as an example of the semiconductor device. The above technology can be applied to various types of semiconductor devices in addition to the SOP type semiconductor device. For example, it can be applied to a QFP type semiconductor device in which a plurality of leads project from the four sides of a quadrilateral sealing body in plan view.

In the above embodiment, a semiconductor device having two semiconductor chips has been described. A high-voltage circuit and a low-voltage circuit may be formed over one semiconductor chip. Alternatively, a semiconductor device may have three or more semiconductor chips.

In the above embodiment, bar-type test terminals 27 which are elastically transformed by using the elastic force of a spring are used as the test terminals 27. However, variations may be used as the test terminals 27. For example, test terminals having a curved part at a halfway position so that they are elastically transformed by the spring property of the curved part may be used in place of the test terminals 27 described in the above embodiment. In consideration of the mechanical life of the test terminals 27, bar-type (in other words, pin-type) test terminals 27 which make use of the elasticity of the spring as in the above embodiment are preferred.

While variations of the invention have been described above, a combination thereof may be employed.

What is claimed is:

1. A semiconductor device manufacturing method, comprising:

(a) sealing a part of a first semiconductor chip having a first circuit and a part of each of a plurality of first leads which are electrically coupled to the first circuit by a sealing body to assemble an object to be inspected which comprises a semiconductor package; and (b) supplying a first potential to the first leads to carry out an electrical test, wherein the first leads are arranged along an extending direction of a first side surface of the sealing body, wherein each of the first leads has a first surface and a second surface on a side opposite to the first surface, wherein the (b) comprises:

(b1) providing a test device having a plurality of first test terminals which are arranged along an arrangement direction of the first leads and a second test terminal which is arranged across the first test terminals along the arrangement direction at a position opposite to the first test terminals, storing the object to be inspected in a storage part of the test device, and arranging the first leads between the first test terminals and the second test terminal;

(b2) bringing the first surfaces of the first leads into contact with the first test terminals, respectively, and the second surfaces of the first leads into contact with the second test terminal; and (b3) after the (b2), supplying the first potential to the first test terminals and the second test terminal, and wherein, in the (b), an insulation withstand voltage test is performed for the first circuit.

2. The semiconductor device manufacturing method according to claim 1, wherein the object to be inspected includes:

a second circuit which operates at a lower voltage than the first circuit; and a plurality of second leads which are electrically coupled to the second circuit, and wherein the (b) further comprises performing the insulation withstand voltage test for the second circuit.

3. The semiconductor device manufacturing method according to claim 2, wherein the (b3) comprises supplying a second potential lower than the absolute value of the first potential to each of the second leads.

4. The semiconductor device manufacturing method according to claim 2, wherein the (b3) comprises supplying a ground potential to each of the second leads.

5. The semiconductor device manufacturing method according to claim 2, wherein the (b3) comprises supplying a second potential lower than the first potential to each of the second leads.

6. The semiconductor device manufacturing method according to claim 1, wherein the second test terminal comprises a substrate and a metal film made of a material harder than the substrate, and wherein the metal film is formed over a contact surface with the first leads in the (b2).

7. The semiconductor device manufacturing method according to claim 1, wherein the test device includes:

the storage part comprising a pedestal for mounting the semiconductor device and a body part coupled to the pedestal by a plurality of springs in the (b1) and:

a pressing mechanism to which the second test terminal is fixed and which is opposed to the storage part, and wherein the (b2) comprises:

(b21) making the pressing mechanism approach the storage part to bring the second test terminal into contact with the first leads of the semiconductor device; and (b22) after the (b21), applying a pressing force to the first leads from the second test terminal to compress the springs so as to bring the first surfaces of the first leads into contact with the first test terminals.

8. The semiconductor device manufacturing method according to claim 2, wherein each of the second leads has a third surface and a fourth surface opposite to the third surface, wherein the test device has a plurality of third test terminals which are arranged along the arrangement direction of the second leads and a fourth test terminal which is arranged across the third test terminals along the arrangement direction at a position opposite to the third terminals, wherein the (b2) comprises bringing the third surfaces of the second leads into contact with the third test terminals, respectively, and the fourth surfaces of the second leads into contact with the fourth test terminal, and wherein the (b3) comprises supplying a second potential to the third test terminals and the fourth test terminal after the (b2).

9. The semiconductor device manufacturing method according to claim 2, wherein each of the second leads has a third surface and a fourth surface opposite to the third surface, wherein the test device includes:

a plurality of third test terminals which are arranged along the arrangement direction of the second leads;

an insulating pressing member which is arranged across the third test terminals along the arrangement direction at a position opposite to the third test terminals;

the storage part; and a pressing mechanism to which the pressing member and the second test terminal are fixed and which is arranged at a position opposite to the storage part, and wherein the (b2) comprises:

(b21) making the pressing mechanism approach the storage part to bring the second test terminal into contact with the first leads of the object to be inspected and the pressing member into contact with the second leads of the object to be inspected; and (b22) after the (b21), applying pressing force from the second test terminal to the first leads to bring the first surfaces of the first leads into contact with the first test terminals and applying pressing force from the pressing member to the second leads to bring the third surfaces of the second leads into contact with the third test terminals.

10. The semiconductor device manufacturing method according to claim 2, further comprising:

(c) supplying different signals to respective first leads through the first test terminals to carry out an electrical test.

11. The semiconductor device manufacturing method according to claim 1, wherein the second test terminal is not coupled to a wire, and wherein the first potential is supplied to the second test terminal through the first leads in contact with the first test terminals in the (b3).

12. A semiconductor device manufacturing method, comprising:

(a) sealing a part of a first semiconductor chip having a first circuit and a part of each of a plurality of first leads electrically coupled to the first circuit by a sealing body to assemble an object to be inspected which comprises a semiconductor package; and (b) supplying a first potential to the first leads to carry out an electrical test, wherein the first leads are arranged along an extending direction of the first side surface of the sealing body, wherein each of the first leads has a first surface and a second surface on the opposite side to the first surface, wherein the (b) comprises:

(b1) storing the object to be inspected in a storage part of a tester having a plurality of first test terminals which are arranged along an arrangement direction of the first leads and a second test terminal which is arranged across the first test terminals at a position opposite to the first test terminals and disposing the first leads between the first test terminals and the second test terminal;

(b2) sandwiching the first leads between the first test terminal provided on the first surface side of the first leads and the second test terminal provided on the second surface side of the first leads, respectively; and (b3) after the (b2), supplying the first potential to the first test terminals and the second test terminal, and wherein, in the (b), an insulation withstand voltage test is performed for the first circuit.

13. The semiconductor device manufacturing method according to claim 12, wherein the object to be inspected includes:

a second circuit which operates at a voltage lower than the first circuit; and a plurality of second leads which are electrically coupled to the second circuit and arranged along an extending direction of the second side surface, different from the first side surface, out of the side surfaces of the sealing body, and wherein the (b) further comprises performing the insulation withstand voltage test for the second circuit.

14. The semiconductor device manufacturing method according to claim 13, wherein the (b3) comprises supplying a second potential lower than an absolute value of the first potential to the second leads.

15. The semiconductor device manufacturing method according to claim 13, wherein the (b3) comprises supplying a ground potential to the second leads.

16. The semiconductor device manufacturing method according to claim 13, wherein the (b3) comprises supplying a second potential lower than the first potential to the second leads.

17. A semiconductor device manufacturing method, comprising:

sealing a part of a first semiconductor chip having a first circuit and a part of each of a plurality of first leads which are electrically coupled to the first circuit by a sealing body to assemble an object to be inspected which is a semiconductor package; and supplying a first potential to the first leads to carry out an electrical test, wherein the first leads are arranged along an extending direction of the first side surface of the sealing body, wherein each of the first leads has a first surface and a second surface opposite to the first surface, and wherein the supplying comprises:

(b1) providing a test device having a plurality of first test terminals which are arranged along an arrangement direction of the first leads and a second test terminal which is arranged across the first test terminals along the arrangement direction at a position opposite to the first test terminals, storing the object to be inspected in the storage part of the test device, and arranging the first leads between the first test terminals and the second test terminal;

(b2) bringing the first surfaces of the first leads into contact with the first test terminals, respectively, and the second surfaces of the first leads into contact with the second test terminal; and (b3) after (b2), supplying the first potential to the first test terminals and the second test terminal, wherein the object to be inspected includes:

a second circuit which operates at a lower voltage than the first circuit; and a plurality of second leads which are electrically coupled to the second circuit and arranged along the extending direction of a second side surface different from the first side surface out of the side surfaces of the sealing body, and wherein the supplying comprises an insulation withstand voltage test for the first circuit and the second circuit.

18. The semiconductor device manufacturing method according to claim 17, wherein the (b3) comprises supplying a second potential lower than an absolute value of the first potential to each of the second leads.

19. The semiconductor manufacturing method according to claim 17, wherein the (b3) comprises supplying a second potential lower than an absolute value of the first potential to the second leads.

* * * * *